(12) United States Patent
Pan et al.

(10) Patent No.: US 11,404,674 B2
(45) Date of Patent: Aug. 2, 2022

(54) DISPLAY PANEL CONFIGURED TO DISPLAY IMAGES AND DISPLAY DEVICE

(71) Applicants: Fuzhou BOE Optoelectronics Technology Co., Ltd., Fuzhou (CN); BOE TECHNOLOGY GROUP CO., LTD., Beijing (CN)

(72) Inventors: Wanping Pan, Beijing (CN); Aihua Zhu, Beijing (CN); Xiaobo Jia, Beijing (CN); Hailong Yu, Beijing (CN)

(73) Assignees: FUZHOU BOE OPTOELECTRONICS TECHNOLOGY CO., LTD., Fuzhou (CN); BOE TECHNOLOGY GROUP CO., LTD., Beijing (CN)

( * ) Notice: Subject to any disclaimer, the term of this patent is extended or adjusted under 35 U.S.C. 154(b) by 205 days.

(21) Appl. No.: 16/652,121

(22) PCT Filed: Jul. 23, 2019

(86) PCT No.: PCT/CN2019/097259
§ 371 (c)(1),
(2) Date: Mar. 30, 2020

(87) PCT Pub. No.: WO2020/024848
PCT Pub. Date: Feb. 6, 2020

(65) Prior Publication Data
US 2020/0251689 A1 Aug. 6, 2020

(30) Foreign Application Priority Data

Jul. 31, 2018 (CN) .......................... 201810856018.X

(51) Int. Cl.
*H01L 51/52* (2006.01)
*H01L 27/32* (2006.01)

(52) U.S. Cl.
CPC ........ *H01L 51/5275* (2013.01); *H01L 27/322* (2013.01); *H01L 2251/5307* (2013.01); *H01L 2251/5315* (2013.01)

(58) Field of Classification Search
USPC .......................................................... 257/40
See application file for complete search history.

(56) References Cited

U.S. PATENT DOCUMENTS 8,497,498 B2  7/2013 Sumida et al.
9,024,302 B2  5/2015 Sumida et al.
(Continued)

FOREIGN PATENT DOCUMENTS

CN    1612658 A    5/2005
CN    101223472 A  7/2008
(Continued)

OTHER PUBLICATIONS

First Office Action, including search report, for Chinese Patent Application No. 201810856018.X, dated Aug. 4, 2021, 15 pages.

*Primary Examiner* — Nduka E Ojeh
(74) *Attorney, Agent, or Firm* — Westman, Champlin & Koehler, P.A.

(57) ABSTRACT

A display panel configured to display images is provided, each image including a plurality of image pixels and each image pixel including a plurality of sub-pixels of different colors, respectively, the display panel including: a base substrate; and a plurality of sub-beam generation components on the base substrate, each sub-beam generation component being configured to generate at least one sub-pixel in at least one image pixel of the image pixels and including: a group of light-emitting units comprising at least one light-emitting unit and corresponding to at least one sub-pixel; and a beam-expanding layer, which is arranged on a light emergent side of the group of light-emitting units and configured to expand light beams emitted from the group of (Continued)

light-emitting units; an orthogonal projection of the beam-expanding layer on the base substrate at least partially overlapping with an orthogonal projection of the group of light-emitting units on the base substrate.

17 Claims, 19 Drawing Sheets

(56) References Cited

U.S. PATENT DOCUMENTS

| | | | |
|---|---|---|---|
| 10,018,750 B2 | 7/2018 | Zhou et al. | |
| 10,910,602 B2 | 2/2021 | Pan et al. | |
| 2002/0004577 A1 | 1/2002 | Biebuyck et al. | |
| 2005/0057177 A1 | 3/2005 | Lu et al. | |
| 2009/0115939 A1 | 5/2009 | Ikuta et al. | |
| 2011/0079797 A1 | 4/2011 | Sumida et al. | |
| 2013/0277659 A1* | 10/2013 | Sumida | H01L 51/5246 257/40 |
| 2015/0084026 A1* | 3/2015 | Miyamoto | H01L 27/3241 257/40 |
| 2015/0236302 A1 | 8/2015 | Gyoung et al. | |
| 2017/0285223 A1 | 10/2017 | Zhou et al. | |
| 2019/0080138 A1* | 3/2019 | Gao | G02B 3/0031 |
| 2019/0207165 A1* | 7/2019 | Pan | G02B 3/0062 |
| 2021/0135170 A1* | 5/2021 | Zhu | H01L 51/5262 |

FOREIGN PATENT DOCUMENTS

| | | |
|---|---|---|
| CN | 102034851 A | 4/2011 |
| CN | 104685404 A | 6/2015 |
| CN | 104900683 A | 9/2015 |
| CN | 107515435 A | 12/2017 |
| CN | 108198844 A | 6/2018 |
| JP | 2005242166 A | 9/2005 |
| JP | 2006332077 A | 12/2006 |
| JP | 2012234093 A | 11/2012 |

* cited by examiner

DISPLAY PANEL CONFIGURED TO DISPLAY IMAGES AND DISPLAY DEVICE

CROSS-REFERENCE TO RELEVANT DISCLOSURE

This application is a Section 371 National Stage Application of International Application No. PCT/CN2019/097259, filed on Jul. 23, 2019, entitled "DISPLAY PANEL AND DISPLAY DEVICE", which published as WO 2020024848 A1, on Feb. 6, 2020, and claims priority to Chinese Patent Application Disclosure No. 201810856018.X filed on Jul. 31, 2018, in the China National Intellectual Property Administration, the contents of which are incorporated herein by reference in their entireties.

BACKGROUND OF THE DISCLOSURE

Field of the Disclosure

Embodiments of the present disclosure generally relate to the technical field of display technology, and in particular, to a display panel and a display device.

Description of the Relevant Art

Organic light-emitting diodes (OLEDs) may be a future direction of display technology which has attracted much attention. OLED display technology has advantages such as self-illumination, all-solid-state, relatively fine mechanical properties, ability of implementation of soft screen display, slimmer appearance, relatively high brightness, more efficient illumination, relatively fast response, low-voltage drive and relatively low power consumption, relatively low cost, less processes, etc. In terms of the colors displayed by OLED products, OLED may for example be divided into monochrome type, multicolor type and full color (i.e., true color) type, among which a preparation of the full color type OLED is the most difficult. In terms of sizes of OLED products, for example, small-sized and medium-sized OLEDs which are for example used in handheld devices, vehicle navigation devices, laptop computers, etc., are typically manufactured by applying low-temperature poly-silicon technology, while large-sized OLEDs which are used in large household appliances, such as TV sets and the like, are typically manufactured by applying oxide technology. At present, small-sized OLED screens have been manufactured in mass production; however, in contrast to small-sized and medium-sized OLED screens applying low-temperature poly-silicon technology, large-sized OLED screens applying oxide technology encounters a variety of technical difficulties through its popularization.

In relevant art, a large-scale organic electroluminescent layer is mainly formed by an evaporation process; however, a large-scale evaporation process has relatively high cost and relatively low yield, and requires to prepare high-precision metal mask (FMM).

SUMMARY OF THE DISCLOSURE

The embodiments of the present disclosure have been made to overcome or alleviate at least one aspect of the above mentioned disadvantages and/or shortcomings in the prior art, by providing a display panel and a display device.

Following technical solutions are adopted in exemplary embodiments of the disclosure.

According to one aspect of embodiments of the disclosure, there is provided a display panel configured to display images, each of which comprises a plurality of image pixels, each image pixel comprising a plurality of sub-pixels of different colors, the display panel comprising:

a base substrate; and a plurality of sub-beam generation components on the base substrate, each sub-beam generation component being configured to generate at least one sub-pixel in at least one image pixel of the plurality of image pixels and comprising:

a group of light-emitting units comprising at least one light-emitting unit; and a beam-expanding layer, which is arranged on a light emergent side of the group of light-emitting units and configured to expand light beams emitted from the group of light-emitting units, wherein an orthogonal projection of the beam-expanding layer on the base substrate at least partially overlaps with an orthogonal projection of the group of light-emitting units on the base substrate.

In exemplary embodiments of the disclosure, the beam-expanding layer comprises a micro-lens unit comprising at least one micro-lens.

In exemplary embodiments of the disclosure, the beam-expanding layer also comprises an optical transmission medium whose refractive index is different from that of the micro-lens unit, and the optical transmission medium is arranged to enclose and to abut against a light emergent surface of the micro-lens unit.

In exemplary embodiments of the disclosure, the refractive index of the optical transmission medium is greater than that of the micro-lens unit.

In exemplary embodiments of the disclosure, the optical transmission medium is further provided with a color filtering section therein, which is configured to optically carry out a color filtering on light beams.

In exemplary embodiments of the disclosure, the refractive index of the optical transmission medium is less than that of a medium which is provided outside the beam-expanding layer and abuts against a light output surface of the beam-expanding layer.

In exemplary embodiments of the disclosure, in a condition that the group of light-emitting units in each sub-beam generation component comprises a plurality of light-emitting units and each sub-beam generation component is configured to present at least one complete image pixel, the micro-lens unit comprises at least one micro-lens, and within the plurality of sub-beam generation components, a distance between adjacent light-emitting units in a same group of light-emitting units is smaller than a distance between the light emitting units respectively located in adjacent groups of light emitting units.

In exemplary embodiments of the disclosure, in a condition that the group of light-emitting units in each sub-beam generation component comprises a single light-emitting unit corresponding to a single sub-pixel and each sub-beam generation component is configured to present a single image pixel, the micro-lens unit arranged opposite to the single light-emitting unit comprises a plurality of micro-lenses formed respectively by colored optical filters of different colors, and the colored optical filters of different colors are configured respectively to optically filter out color components of the light beams which have colors other than those of respective sub-pixels in the single image pixel to be presented.

In exemplary embodiments of the disclosure, in a condition that the group of light-emitting units in each sub-beam generation component comprises a single light-emitting unit and each sub-beam generation component is configured to present a single image pixel, the micro-lens unit comprises a micro-lens, and the color filtering section comprises a plurality of color filtering sub-pieces which are spaced apart from one another and configured respectively to optically filter out color components of the light beams which have colors other than those of respective sub-pixels in the single image pixel to be presented.

In exemplary embodiments of the disclosure, in each micro-lens unit, the at least one micro-lens comprises a plurality of secondary micro-lenses arranged in multiple layers.

In exemplary embodiments of the disclosure, each micro-lens comprises a convex lens or a concave lens.

In exemplary embodiments of the disclosure, each micro-lens unit comprises a plurality of micro-lens each being in a form of a spherical crown shape or a spherical crown shape having a rectangular bottom surface.

In exemplary embodiments of the disclosure, each micro-lens unit expands a light beam emitted from the group of light-emitting units opposite to the micro-lens unit, in a direction orthogonal to a normal direction of the display panel or in two directions which are perpendicular to each other.

In exemplary embodiments of the disclosure, each light-emitting unit is a light-emitting unit in a form of an organic light-emitting diode.

In exemplary embodiments of the disclosure, each light-emitting unit in the form of an organic light-emitting diode comprises an anode, a cathode and an organic light-emitting material layer between the anode and the cathode.

In exemplary embodiments of the disclosure, each light-emitting unit in the group of light-emitting units is a light-emitting unit in a form of a bottom emission type organic light-emitting diode, and the beam-expanding layer is located between the group of light-emitting units and the base substrate.

In exemplary embodiments of the disclosure, each light-emitting unit in the group of light-emitting units is a light-emitting unit in a form of a top emission type organic light-emitting diode, and the beam-expanding layer is located on a side of the group of light-emitting units facing away from the base substrate.

In exemplary embodiments of the disclosure, the single light-emitting unit is a white light-emitting unit.

In exemplary embodiments of the disclosure, the micro-lens unit comprises a plurality of micro-lenses; and the plurality of light-emitting units and the plurality of micro-lenses are arranged opposite to each other in one-to-one correspondence; and a color filtering section located in the beam expanding layer comprises a plurality of color filtering portions whose colors are the same as those of the plurality of light-emitting units, respectively.

According to another aspect of the exemplary embodiment of the present disclosure, there is provided a display device, comprising the display panel as above.

BRIEF DESCRIPTION OF THE DRAWINGS

In order to more clearly explain technical solutions of embodiments of the disclosure, a brief description of the drawings of the embodiments will be made hereinafter. It should be known that the drawings described below merely refer to some embodiments of the disclosure, rather than restricting the disclosure, wherein.

DETAILED DESCRIPTION OF EMBODIMENTS OF THE DISCLOSURE

Figure 1A:
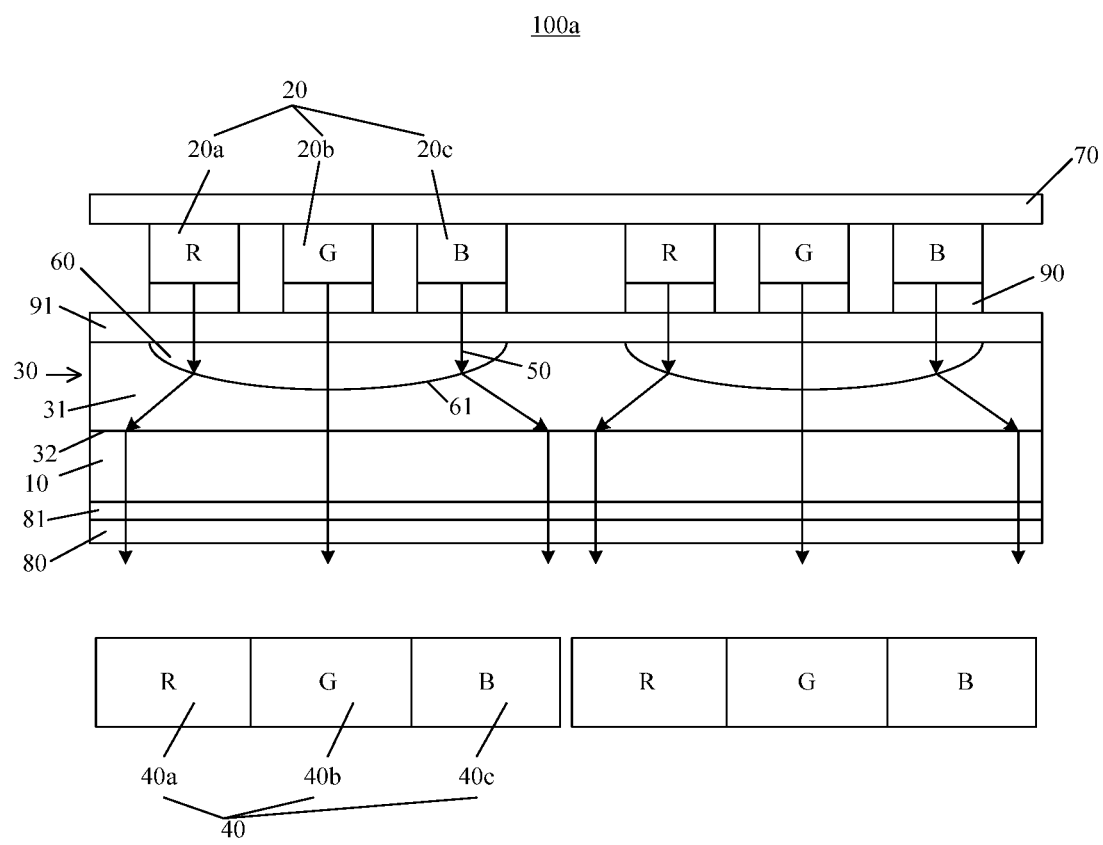
FIG. 1(a) illustrates a structural schematic view of a display panel according to an embodiment of the present disclosure.

In order to set forth purposes, technical solutions and advantages of the disclosure more clearly, exemplary embodiments will now be described in detail with reference to the accompanying drawings. It should be understood that the following description of embodiments is intended to explain and clarify a general concept of the disclosure, and should not be construed as a limitation of the disclosure. In the specification and drawings, same or similar reference numerals refer to same or similar parts or components. For clarity, the drawings are not necessarily drawn to scale, and some known parts and structures may be omitted from the drawings.

Unless otherwise defined, the technical or scientific terms used in the disclosure shall be the general meaning understood by those skilled having general skills in the field to which the disclosure belongs. Words "first", "second" and the like used in the present disclosure merely intend to distinguishing different components, rather than indicating any order, quantity or importance. Wordings "a/an" or "one" and the like do not exclude the existence of a plurality of elements, components and the like. Words "comprise" or "contain" or the like mean that elements or objects appearing before such may cover elements or objects and their equivalents appearing after such, without excluding other elements or objects. Words like "connect" or "communicate" or the like may comprise electrical connections, whether direction or indirect, rather than being limited to physical or mechanical connections. Expressions "Up", "down", "left", "right", "top" or "bottom" are merely used to represent relative position relations; and once absolute positions of the objects as described are changed, then the relative position relations may also change accordingly. In a condition that an element such as a layer, a film, a region, or a base substrate may be referred to as being located "on/above/over" or "under/below" another element, then the element may be "directly" located "over" or "under" another element, or there may be an intermediate element existing therebetween.

Respective dimension and shape of each component in the drawings are merely intended to exemplarily illustrate the contents of the disclosure, rather than to demonstrate the practical dimension or proportion of components of the display panel and the display device in the embodiment of the present disclosure.

It has been found by the inventor of the disclosure that, in relevant art, a large-sized OLED display panel has a plurality of light-emitting units arranged intensively, relatively large power consumption and relatively difficult heat dissipation. An increase in power consumption will cause an increase in heat inside the display panel, even resulting in a destruction of the display panel. If spacing between two adjacent light-emitting units may be enlarged, the display effect may in turn be affected. Therefore, it is expected to implement an OLED display panel that may achieve a superior display effect in a condition that the spacing between adjacent light-emitting units is set to be relatively large.

Figure 1B:
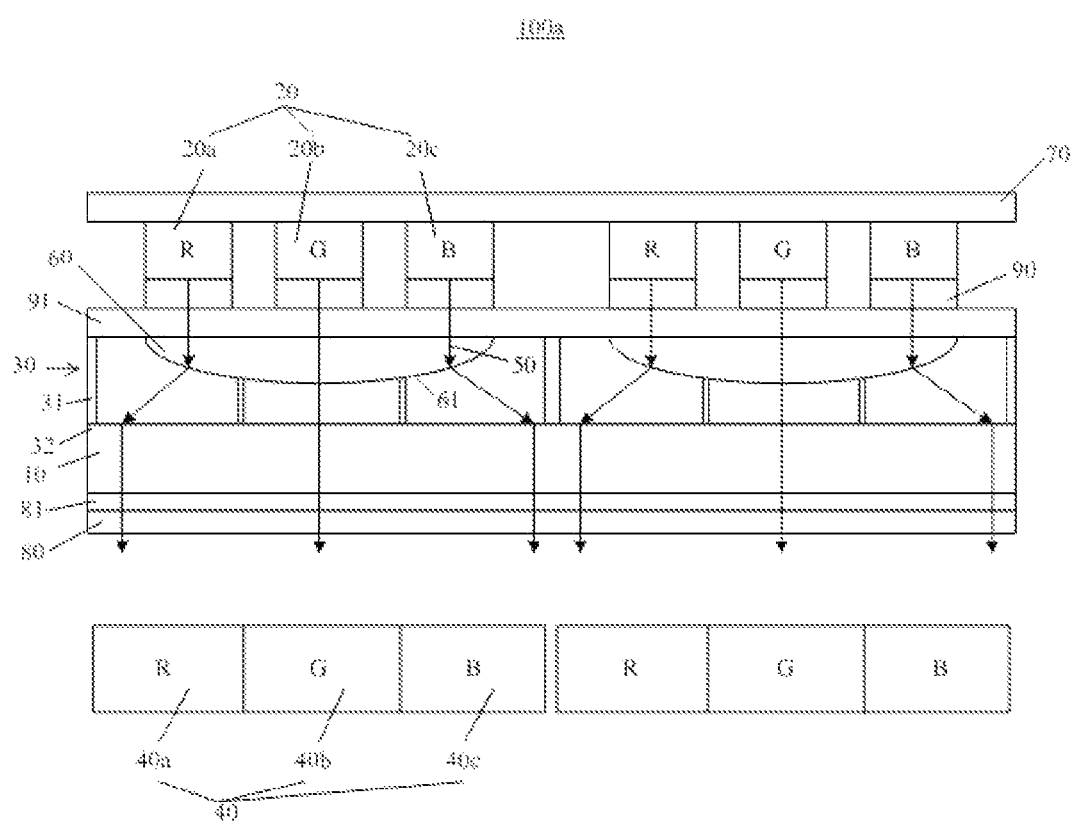
FIG. 1(b) illustrates a structural schematic view of a further exemplary display panel based on the display panel as illustrated in FIG. 1(a)

According to a general inventive technical concept of embodiments of the disclosure, FIG. 1 illustrates a display panel 100a configured to display images according to embodiments of the disclosure, each image comprises a plurality of image pixels, and each image pixel comprises a plurality of sub-pixels 40 of different colors, the display panel 100a comprises: a base substrate 10 (for example a glass substrate or a substrate formed by other transparent material(s)); and a plurality of sub-beam generation components provided on the base substrate, each sub-beam generation component being configured to generate the plurality of sub-pixels in at least one image pixel of the plurality of image pixels. And each sub-beam generation component comprises: a group of light-emitting units 20 comprising at least one light-emitting unit; and a beam-expanding layer 30, which is arranged on a light emergent side of the group of light-emitting units and configured to expand light beams emitted from the group of light-emitting units. Moreover, in the display panel, for example, in adjacent sub-beam generation components, light-emitting units of respective groups thereof are arranged to space apart from each other or one another, and respective beam-expanding layers in adjacent sub-beam generation components are for example provided in a same layer. By way of example, as illustrated, the group of light-emitting units in each sub-beam generation component comprises at least one light-emitting unit, and respective multiple groups of light-emitting units 20 of adjacent sub-beam generation components are provided on a side of the base substrate 10 (for example located over a side of the base substrate 10, as illustrated) and spaced apart from the base substrate 10. Furthermore, for example, the group of light-emitting units in each sub-beam generation component comprises at least one light-emitting unit. Moreover, an orthogonal projection of the beam-expanding layer 30 on the base substrate 10 at least partially overlaps with an orthogonal projection of the group of light-emitting units on the base substrate 10.

Furthermore, by way of example, the beam-expanding layer 30 comprises a micro-lens unit, and the micro-lens unit comprises at least one micro-lens. Moreover, in each micro-lens unit, the at least one micro-lens comprises a plurality of secondary micro-lenses arranged in multiple layers. Respective beam-expanding layers 30 of the plurality of sub-beam generation components are for example arranged in a same layer, and their respective micro-lens units form an array of micro-lens units, and said array of micro-lens units for example comprises a plurality of micro-lens units 60 arranged in a matrix.

More specifically, for example, the multiple groups of light-emitting units 20 and the respective beam-expanding layers 30 cooperate with each other to define the plurality of sub-beam generation components, and each sub-beam generation component comprises a respective one group of light-emitting units in the multiple groups of light-emitting units 20 and a respective one micro-lens unit in the plurality of micro-lens units 60, both of which are provided in one-to-one correspondence to be opposite to each other; and an orthogonal projection of the respective one micro-lens unit 60 on the base substrate 10 at least partially overlaps with an orthogonal projection of the respective one group of light-emitting units 20 on the base substrate 10. It should be noted that, each group of light-emitting units 20 is provided corresponding to respective at least one image pixel, i.e., light emitted by each group of light-emitting units 20 travels therethrough and in turn through the respective beam-expanding layer 30, and then exits as different monochromatic sub-beams (abbreviated as sub-beams hereinafter) which finally present different monochromatic sub-pixels 40 so as to jointly/collectively define respective at least one image pixel; moreover, the multiple groups of light-emitting units 20 cooperate with one another to jointly/collectively define the whole image. As such, each sub-beam generation component for example equivalently functions as a physical pixel which generates the respective at least one image pixel.

Expressions "in one-to-one correspondence", "corresponding to" mean that respective orthogonal projections of two elements connected thereby on the base substrate at least partially overlap with each other.

Figure 4A:
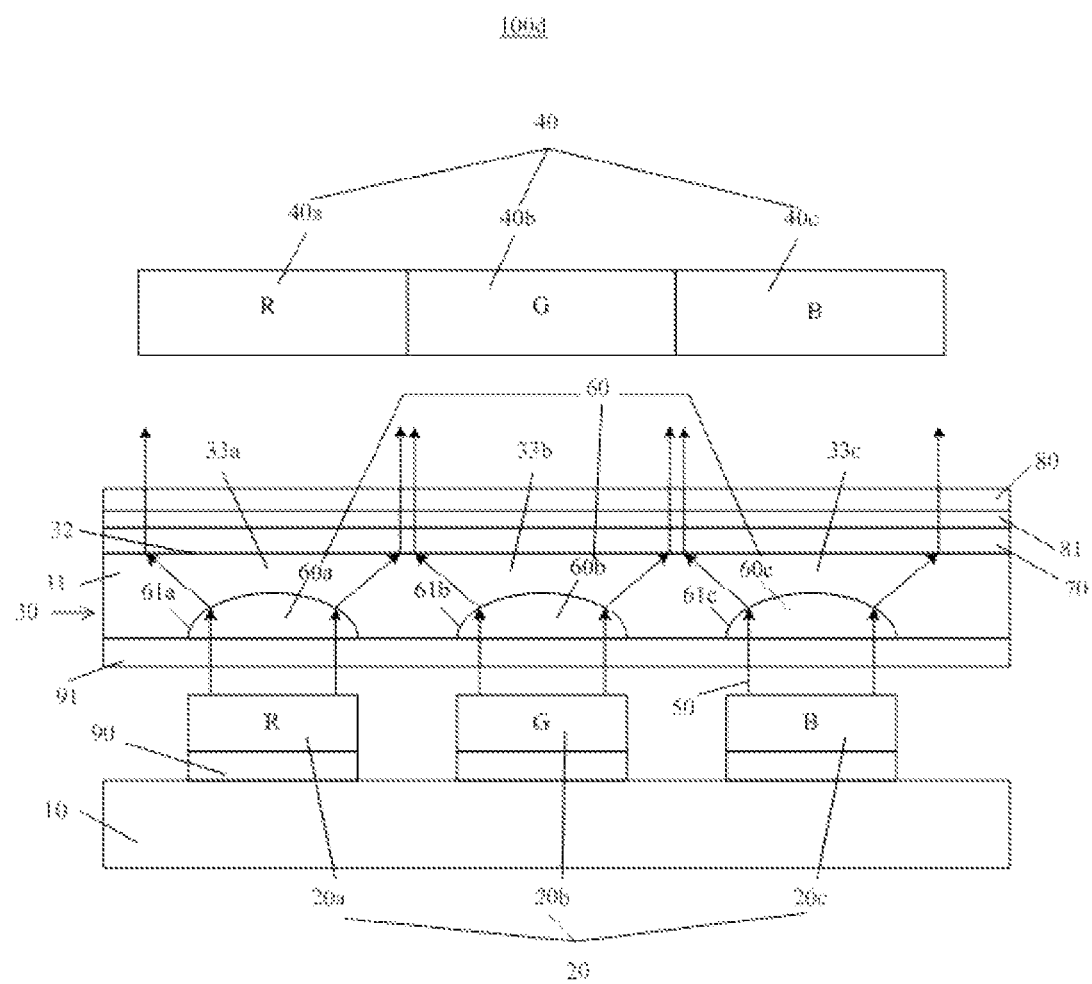
FIG. 4(a) illustrates a structural schematic view of a display panel according to yet another embodiment of the present disclosure.
Figure 8:
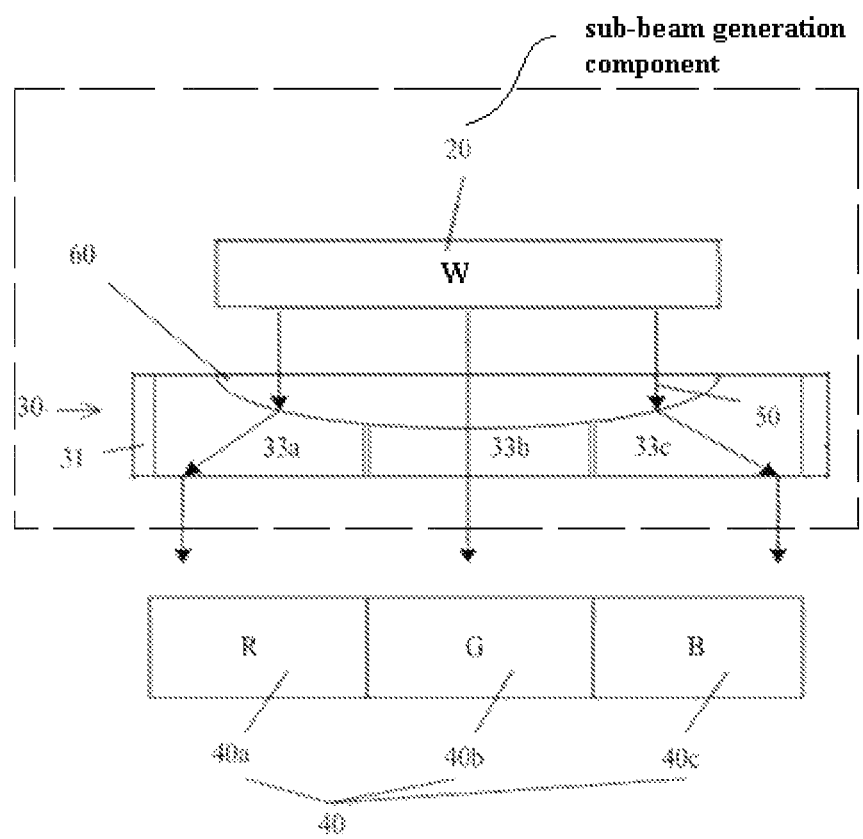
FIG. 8 illustrates a structural schematic view of a sub-beam generation component functioning as a physical pixel in a display panel according to embodiments of the present disclosure.

FIG. 1 (a) to FIG. 4 (b) schematically illustrate various structures of a display panel according to embodiments of the present disclosure, and FIG. 5 (a) to FIG. 8 schematically illustrate various structures of a sub-beam generation component functioning as a physical pixel in a display panel according to embodiments of the present disclosure. In FIG. 1 (a) to FIG. 8 (b), a specific physical structure is illustrated in an upper portion of each illustration, and an image pixel presented by the sub-beams which are formed by the specific physical structure and exit the display panel is illustrated in a lower portion of each illustration.

In various specific embodiments of the present disclosure, the aforementioned general technical concept may for example be substantially summarized as: multiple groups of light-emitting units emit light beams, which are expanded through respective beam-expanding layers and in turn form emergent light beams which present an image comprising a plurality of image pixels.

Further, in the field of display technology, a generation of monochromatic sub-beams which present different color sub-pixels respectively is explored. Since there typically exist both monochromatic light sources (such as red (R) light sources, green (G) light sources, blue (B) light sources) and white (W) light sources (e.g., white OLED light sources, i.e. WOLED light sources), then, monochromatic light sources of different colors generate monochromatic light of different colors respectively; and a white light source requires to cooperate with different color filters to generate monochromatic light of different colors, respectively. Therefore, in embodiments of the present disclosure, for each group of light-emitting units, in order to present different monochromatic sub-pixels respectively, for example, generation of monochromatic sub-pixels may be realized before, during and after beam expansion.

Specifically, on one hand, in embodiments of the disclosure, for example, by directly providing a plurality of monochromatic light sources of different colors (such as red (R), green (G), blue (B) light sources) to realize the generation of monochromatic sub-beams before beam expansion; or, for example, by providing at least one white (W) light source and color filters of different colors located on or adjacent to a light exiting surface of the at least one white (W) light source (for example, opposite to the at least one white light source) respectively, monochromatic sub-beams may be generated respectively before beam expansion. These two methods for realizing the generation of monochromatic sub-beams before beam expansion are substantially equivalent. Therefore, in specific embodiments of the disclosure hereinafter, for example, inside each group of light-emitting units, a plurality of monochromatic light-emitting units of different colors are used to directly emit monochromatic sub-beams of different colors, respectively; or, for example, inside each group of light-emitting units, a plurality of filter colors of different colors cooperate with respective opposite portions (i.e., portions opposite to the plurality of filter colors of different colors) of the at least one white light-emitting unit to equivalently function as a plurality of monochromatic light-emitting units of different colors so as to emit monochromatic sub-beams of different colors in cooperation, which may not be distinguished in the disclosure, for example, as illustrated respectively in the accompanying FIG. 5 (a) to FIG. 6 (b).

Specifically, on another hand, in alternative embodiments of the present disclosure, for example, in a condition that each group of light-emitting units merely comprises at least one white light-emitting unit as light-emitting unit(s) therein, for example, by providing a corresponding number (i.e., the same number as specific number of sub-pixels required to be presented respectively with sub-beams of different colors which are already generated) of micro-lenses in each micro-lens unit, and by using the color filters to form the micro-lenses in each micro-lens unit in the beam-expanding layer, specifically, for example, by providing a color adhesive film (or referred to as color glue film) on at least one of a light incident surface and a light emergent surface of each micro-lens unit (i.e., fabricating micro-lenses by a process of attaching color filtering film on surface), or by providing a color adhesive film (or referred to as color glue film) inside each micro-lens unit (i.e., fabricating micro-lenses by a process of interposing and laminating a film between glass pieces), or by using colored optical glass to manufacture each micro-lens unit (i.e., fabricating micro-lenses by a colored glass process), then, monochromatic sub-beams may be generated respectively during beam expansion, for example, as illustrated respectively in the accompanying FIG. 7 (a) to FIG. 7 (b).

Specifically, on the other hand, in another alternative embodiment of the present disclosure, for example, in a condition that each group of light-emitting units merely comprises at least one white light-emitting unit as light-emitting unit(s) therein, for example, by providing a single micro-lens in each micro-lens unit in a beam expanding layer and providing a corresponding number (i.e., the same number as specific number of sub-pixels required to be presented respectively with sub-beams of different colors which are already generated) of color filtering sub-pieces which abut against a light emergent surface of the single micro-lens unit, around the light emergent surface of the single micro-lens unit, then, monochromatic sub-beams may be generated respectively after beam expansion, as illustrated in the accompanying FIG. 8.

Figure 2:
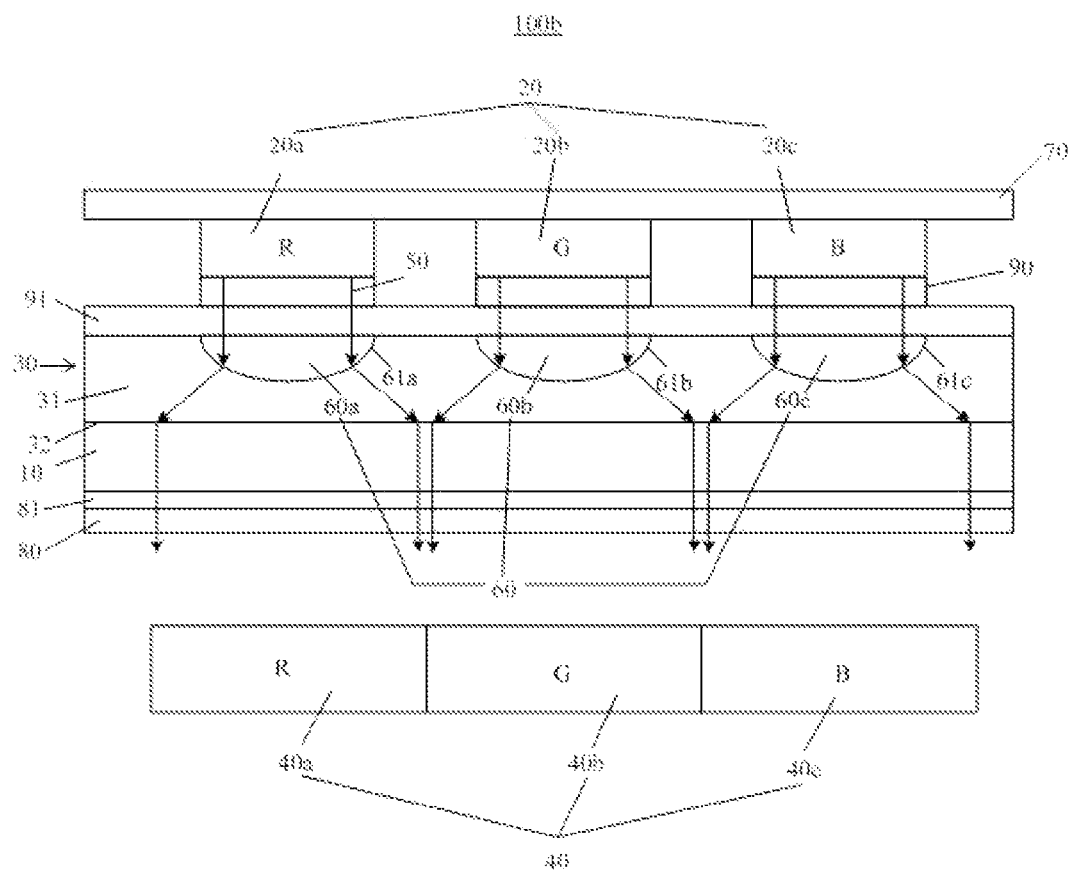
FIG. 2(a) illustrates a structural schematic view of a display panel according to another embodiment of the present disclosure.
FIG. 2(b) illustrates a structural schematic view of a further exemplary display panel based on the display panel as illustrated in FIG. 2(a)
Figure 2B:
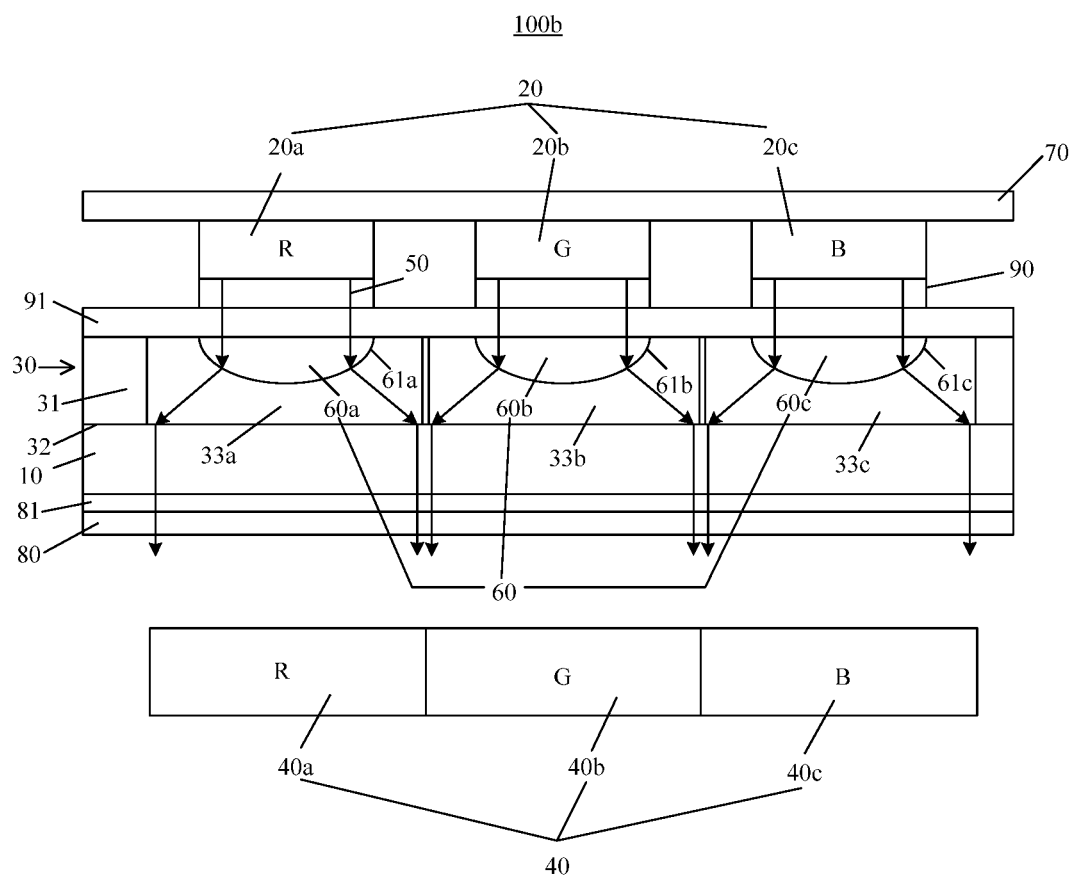

FIG. 1 (a) illustrates a structural schematic view of a display panel according to an embodiment of the present disclosure; and FIG. 2 (a) illustrates a structural schematic view of a display panel 100b according to another embodiment of the present disclosure. In each sub-beam generation component, the group of light-emitting units comprises a plurality of light-emitting units and each sub-beam generation component is configured to present at least one complete image pixel (illustrated to present a complete image pixel), and the micro-lens unit comprises at least one micro-lens.

More specifically, in the exemplary embodiments of FIG. 1 (a), as illustrated therein, in each sub-beam generation component, the group of light-emitting units comprises a plurality of light-emitting units, and the at least one micro-lens contained in the micro-lens unit is merely a single micro-lens, and each sub-beam generation component is configured to present at least one complete image pixel (illustrated to present a complete image pixel). In other words, in each sub-beam generation component for forming a single image pixel, the plurality of light-emitting units may share a micro-lens located downstream of them. Each group of light-emitting units 20 in the multiple groups of light-emitting units 20 for example comprises three monochromatic light-emitting units of different colors, namely, a red (R) light-emitting unit, a green (G) light-emitting unit, and a blue (B) light-emitting unit, which are for example spaced apart from one another; and the three light-emitting units correspond to three sub-pixels, respectively, i.e., red (R) sub-pixel 40*a*, green (G) sub-pixel 40*b*, and blue (B) sub-pixel 40*c*. However, this example is merely exemplary, and embodiments of the present disclosure are not limited thereto, for example, each group of light-emitting units 20 in the multiple groups of light-emitting units 20 may comprise at least one light-emitting unit 20 (such as one, two, four or more light-emitting units 20) and each light-emitting unit 20 corresponds to a respective one sub-pixel 40, that is to say, each group of light-emitting units 20 may correspond to at least one sub-pixel 40.

As an equivalent embodiment similar to the embodiment of FIG. 1 (*a*), each group of the multiple groups of light-emitting units 20 for example comprises: at least one white (W) light-emitting unit; and color filters of different colors which are for example spaced apart from one another, and located on a light exiting surface of the at least one white (W) light-emitting unit by abutting tightly thereupon or located adjacent to the light exiting surface of the at least one white (W) light-emitting unit (e.g., located opposite to the at least one white light-emitting unit). The color filters of different colors (such as red color filter, green color filter, and blue color filter) and respective portions of the at least one white light-emitting unit arranged opposite to the color filters respectively cooperate with each other to function as a plurality of equivalent monochromatic light-emitting units of different colors, such as an equivalent red (R) light-emitting unit, an equivalent green (G) light-emitting unit and an equivalent blue (B) light-emitting unit, which may not be distinguished from embodiments as illustrated in FIG. 1(*a*).

In the present disclosure, "a light-emitting unit corresponds to a sub-pixel" or "light-emitting units correspond to sub-pixels" means that in a display image of the display panel, light beams emitted by the light-emitting unit(s) finally exit the display panel so as to represent the sub-pixel(s). By way of example, the light-emitting unit(s) may for example comprise OLED light-emitting unit(s).

Beam-expanding layers 30 are for example located respectively on the light emergent side of the multiple groups of light-emitting units 20 and configured to expand or widen a respective light beam 50 emitted from respective groups of light-emitting units 20. By way of example, the beam-expanding layers 30 are for example provided on the same side of the base substrate 10 as the multiple groups of light-emitting units 20, as illustrated in FIG. 1 (*a*), between the base substrate 10 and the multiple groups of light-emitting units 20. Specifically, as illustrated in FIG. 1 (*a*), the beam-expanding layers 30 are directly formed on a side surface of the base substrate 10 (an upper side as illustrated), and the multiple groups of light-emitting units 20 are provided on a same side of the base substrate 10 as the beam-expanding layers 30, and are illustrated to be provided over a side of the beam-expanding layers 30 facing away from the base substrate 10 and are arranged to space apart from the beam-expanding layers 30. And, as illustrated in FIG. 1 (*a*), a micro-lens unit is provided in a respective one beam-expanding layer 30, and the micro-lens unit 60 is arranged in a two-dimensional matrix perpendicular to a normal direction of the display panel and opposite to a respective one group of light-emitting units 20 (or be aligned with the respective one group of light-emitting units 20; in other words, an orthogonal projection of the micro-lens unit 60 on the base substrate 10 at least partially overlaps with an orthogonal projection of the respective one group of light-emitting units 20 on the base substrate 10). And the light incident surface of each micro-lens unit 60 is for example an upper surface of each micro-lens unit facing towards the respective one group of light-emitting units 20 and facing away from the base substrate 10 as illustrated in FIG. 1(*a*), and the light emergent surface of each micro-lens unit 60 is for example a lower surface of each micro-lens unit facing towards the base substrate 10 as illustrated in FIG. 1(*a*). An expansion effect of the beam-expanding layer 30 on the light beam 50 is mainly implemented by various micro-lenses 60 contained in the micro-lens unit which is provided in the beam-expanding layer 30. After the light beam 50 emitted by the respective one group of light-emitting unit 20 is already expanded by the micro-lens unit 60, a cross-sectional area of the light beam 50 will be increased, such that a display area of the plurality of sub-pixels (i.e., at least one image pixel defined collectively/jointly by the plurality of sub-pixels) corresponding to the respective group of light-emitting units 20 may be increased. Then, in a condition that the whole display area of the display panel constantly remains the same, the existence of the beam-expanding layers 30 may decrease specific number of light-emitting units as required. As such, for example, a reduction in the specific number of light-emitting units 20 is implemented by increasing the distance among different groups of light-emitting units 20. By way of example, provided that an area of the light beam incident on the beam-expanding layer 30 is S1 while an area of a respective light beam which is expanded from said light beam by the beam-expanding layer 30 and in turn exits the beam-expanding layer 30 is S2, then an amplification factor (or referred to as a magnification factor) of the light beam may be defined as k=S2/S1. By way of example, the magnification factor of light beam by the beam-expanding layer 30 for example ranges between 1.1 and 1.5. The magnification factor of light beam may for example depend on specific arrangement and specific topography of the respective micro-lens unit. Since as illustrated in FIG. 1(*a*), in each sub-beam generation component, the respective group of light-emitting units comprises the plurality of light-emitting units and the respective micro-lens unit comprises merely the single micro-lens, and said each sub-beam generation component is configured to present one complete image pixel, then, the micro-lens unit 60 is provided to face towards and be opposite to the respective group of light-emitting units 20, i.e., an orthogonal projection of the micro-lens unit 60 on the base substrate 10 at least partially overlaps with an orthogonal projection of the respective group of light-emitting units 20 (facing towards and opposite to the micro-lens unit) on the base substrate 10; therefore, an operation of beam expansion by the beam-expanding layer 30 is carried out corresponding to one or more complete light-emitting units 20 (or one or more image pixels).

Figure 14:
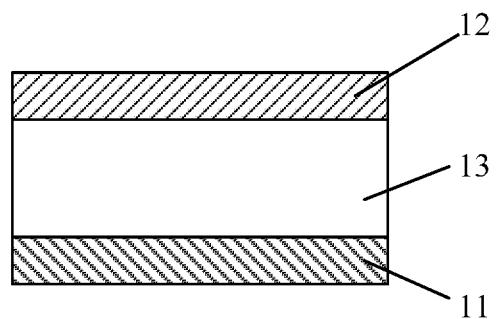
FIG. 14 illustrates an exemplary structure of a light-emitting unit in embodiments of the present disclosure.

In embodiments of the present disclosure, as illustrated in FIG. 14, each light-emitting unit 20 for example comprises an anode 11, a cathode 12, and an organic light-emitting material layer 13 located between the anode 11 and the cathode 12. By way of example, the light-emitting unit 20 also for example comprises a hole injection layer, a hole transmission layer, an electron transmission layer, an electron injection layer, and the like so as to improve light-emitting efficiency. However, the embodiments of the present disclosure are not limited thereto, and other light-emitting structures of relevant art (e.g., OLED light-emitting structures of relevant art) may also be adopted. It should be noted that, for example, each light-emitting unit 20 is arranged to correspond to a respective one sub-pixel; or alternatively, each light-emitting unit 20 is arranged to correspond to a plurality of sub-pixels, for example, a single white light-emitting unit (such as a WOLED light-emitting unit) is designed to be additionally provided with optical filters of different colors in an optical path located downstream of the single white light-emitting unit, such that the white light emitted thereby is then transmitted through said optical filters of different colors, thereby forming light beams of different colors for being incident on sub-pixels of different colors which are to present different colors, i.e., corresponding to the sub-pixels of different colors. Or alternatively, for example, each light-emitting unit 20 may also correspond to merely one pixel.

In the example of FIG. 1(*a*), a group of light-emitting units 20 comprises three light-emitting units 20 corresponding to three sub-pixels respectively. These three sub-pixels cooperate with one another to form an image pixel. Therefore, in fact, the group of light-emitting units 20 is set to correspond to the respective complete image pixel, and accordingly, each micro-lens unit 60 is also set to correspond to the respective complete image pixel. Therefore, on the one hand, it may be clearly seen from FIG. 1 (*a*) that due to the existence of the beam-expanding layer 30 comprising the micro-lens unit, in a direction perpendicular to the normal direction of the display panel, for example, in a transverse direction and a longitudinal direction (the longitudinal direction is defined as a lengthwise direction of the display panel, and the transverse direction is defined as a widthwise direction perpendicular to both the normal direction and the longitudinal direction of the display panel, for example), there is a relatively large gap between two adjacent groups of light-emitting units 20. If there is no beam-expanding layer 30, the light beam 50 will exit directly from the light emergent side below. When an observer looks at the display panel from a bottom of the display panel in a direction facing the light beam 50, an emergent light intensity observed at a position below the display panel and corresponding to the gap between the two adjacent groups of light-emitting units 20 will be significantly lower than that at a position corresponding to the light-emitting units, such that it is possible for the observer to see a relatively wide and clear boundary between image pixels, resulting in a strong sense of graininess (i.e., granular sensation) in the displayed image(s) as observed. However, in the example of FIG. 1 (*a*), due to the existence of the beam-expanding layer 30, respective light beams 50 emitted from the two adjacent groups of light-emitting units 20 are all expanded. Therefore, when the observer views the display panel from the bottom of the display panel in the direction facing the light beam 50, the emergent light intensity observed at the position below the display panel and corresponding to the gap between the two adjacent groups of light-emitting units 20 is compensated, increasing a uniformity of an overall light intensity of output light of the display panel, and enhancing the display effect.

On the other hand, due to the existence of the beam-expanding layer 30 comprising the micro-lens unit, the light beam 50 emitted from the light-emitting units will be expanded after being propagated to pass through the beam-expanding layer 30. Accordingly, due to such a compensation effect of the beam-expanding layer 30 on the size of the light beam 50, the gap between the two adjacent groups of light-emitting units 20 may be set to be larger than that without the beam-expanding layer 30. Specifically by way of example, in fact, physical pixels are usually provided to be adjacent to (e.g., to abut against) each other or one another in relevant art; while at present, due to the beam-expansion effect/function of the beam-expanding layer, a certain distance may be reasonably set to space the physical pixels apart from one another, and the distance between each two adjacent current physical pixels (i.e. each two sub-beam generation components) must be less than the distance between the two adjacent physical pixels which would have been adjacent to each other, i.e. less than a width of one physical pixel (i.e., a single sub-beam generation component); thereby improving the heat dissipation property of the display panel, reducing a probability of burning the screen. As to the display panel according to the embodiments of the disclosure, the sense of graininess (i.e., granular sensation) in the displayed image(s) may be minimized as much as possible and the heat dissipation effect of the display panel may be enhanced simultaneously, through a divergence effect of the beam-expanding layer on light incident thereon, so as to obtain a relatively good balance/compromise between picture quality and heat dissipation property.

At the same time, the gap between the two adjacent groups of light-emitting units 20 increases, resulting in that the organic light-emitting material layer in the light-emitting unit 20 is distributed to be more dispersed on the display panel so as to reduce a difficulty in an evaporation process (for example, a tolerance of the gap between the two adjacent groups of light-emitting units 20 may become larger), so as to reduce requirements on the precision of a high-precision metal mask as required, and in turn to improve the yield of the display panel.

In addition, due to the increase in the gap between two adjacent groups of light-emitting units 20, it is possible to reduce specific number of light-emitting units 20 on the display panel, so as to save raw materials, decrease power consumption and cost. Furthermore, the increase in the gap between the two adjacent groups of light-emitting units 20 facilitates an increase in the size of the display panel provided that respective specific numbers of image pixels and the physical pixels generating the image pixels (i.e. the sub-beam generation components) remain unchanged, which fact may facilitate a reduction in power consumption and also facilitate an increase in improving the yield of large-sized display screen and reducing the probability of burning the screen, as compared with a condition in which the size of the display panel is increased provided that respective specific numbers of image pixels and the physical pixels generating the image pixels (i.e. the sub-beam generation components) are both increased.

By way of example, the beam-expanding layer 30 for example further comprises a transmission layer 31 formed by an optical transmission medium 31. In the transmission layer, the optical transmission medium 31 is arranged to enclose and to abut closely against the light emergent surface 61 of the micro-lens unit 60. The optical transmission medium 31 is for example formed by a transparent material having a refractive index different from that of the micro-lens unit 60. According to the refraction principle, a propagation direction of the light beam 50 will change at an interface (e.g., the light emergent surface 61) between the micro-lens unit 60 and the optical transmission medium 31. In a condition that the refractive index of the optical transmission medium 31 is larger than that of the micro-lens unit 60, it is advantageous to realize the expansion of the light beam 50. An example of the micro-lens unit 60 in a form of a convex lens or a concave lens will be described below with reference to FIG. 15 and FIG. 16, respectively.

In some examples, the optical transmission medium 31 is selected such that the refractive index of the optical transmission medium 31 is less than a refractive index of a medium which is provided outside the beam-expanding layer 30 and abuts against a light output surface 32 of the beam-expanding layer 30. In the example of FIG. 1, since the beam-expanding layer 30 is directly provided on the base substrate 10, then the base substrate 10 directly functions as the medium provided outside the beam-expanding layer; however, the embodiment of the present disclosure is not limited thereto, for example, the medium is also another insulation layer adjacent to (e.g., abutting against) the light output surface 32 of the beam-expanding layer 30 (for example, an insulation layer additionally interposed between the light output surface 32 of the beam-expanding layer 30 and the base substrate 10). According to the refraction principle, since the refractive index of the optical transmission medium 31 is less than that of the medium abutting against the light output surface 32 of the beam-expanding layer 30, it is advantageous to realize an aggregation or convergence of the expanded light beam 50, so as to avoid any mutual interference of colors of the adjacent sub-pixels having different colors. By way of example, the optical transmission medium 31 is for example formed by materials having following components of respective contents/proportions: 5% to 30% epoxy acrylate copolymer, 0 to 3% multifunctional group monomer, and 60 to 90% propylene glycol methyl ether acetate. However, the embodiments of the present disclosure are not limited thereto, and various materials of relevant art in the field that are capable of implementing corresponding light transmission function and meeting the above requirements on refractive index may be used.

In some embodiments of the present disclosure, in a condition that each group of light-emitting units 20 comprises the plurality of said light-emitting units, a distance between adjacent light-emitting units in a same group of light-emitting units is set to be smaller than a distance between the light emitting units respectively located in adjacent groups of light emitting units. The distance between adjacent light-emitting units in a same group of light-emitting units is set to be relatively small, which facilitates the arrangement of micro-lens units. As the light beams emitted from the light-emitting units in the same group of light-emitting units are expanded/amplified by a respective micro-lens unit, then it is not necessary to provide the gap between adjacent light-emitting units in the same group of light-emitting units to be as small as a gap between adjacent light-emitting units in the same group of light-emitting units without any beam-expanding layer, then, in other words, the gap between adjacent light-emitting units in the same group of light-emitting units may also for example be set to be amplified, with the amplification/expansion of the light beams emitted from the light-emitting units in the same group of light-emitting units as implemented by a respective micro-lens unit. However, if the distance between adjacent light-emitting units in the same group is set to be excessively large, then it is easy to cause the gap between respective sub-pixels corresponding to the same group of light-emitting units to be excessively large and in turn to generate the sense of graininess (i.e., granular sensation). If the distance between the adjacent groups of light-emitting units is set to be relatively large, then it will help to improve the heat dissipation property and to reduce the difficulty in the manufacturing process of the display panel.

Figure 10:
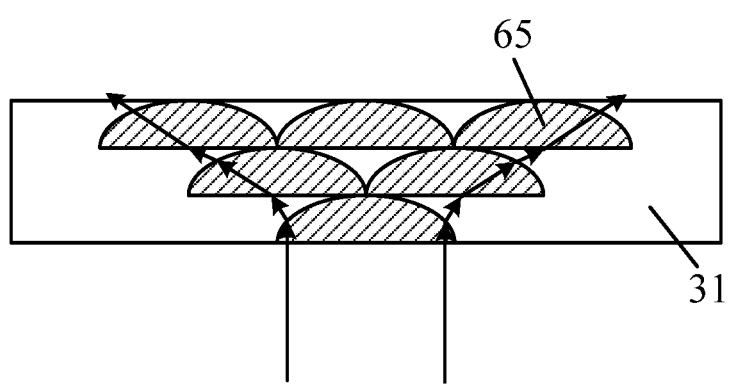
FIG. 10 illustrates a schematic view of a micro-lens unit comprising a multi-layered micro-lens structure.

In some examples, the micro-lens units 60 for example comprise a plurality of micro-lenses arranged in a single layer, as illustrated in FIG. 1. As alternative embodiments, the micro-lens unit for example comprises a plurality of secondary micro-lenses 65 arranged in multiple layers. FIG. 10 illustrates an example of a plurality of secondary micro-lenses arranged in multiple layers. In the example of FIG. 10, the micro-lens unit comprises three layers of secondary micro-lenses 65, and in the propagation direction of light, specific number of the secondary micro-lenses 65 of each layer in a single micro-lens unit increases gradually, for example, one is added for each layer as illustrated, that is to say, the secondary micro-lenses in the single micro-lens unit are arranged to be a tower shape or arranged in a form of a tower shape. As seen from FIG. 10, the light beam 50 will be further expanded once passing through a further more layer of secondary micro-lenses 65. As compared with the micro-lens unit having the plurality of secondary micro-lenses arranged in a single layer, the micro-lens unit having the plurality of secondary micro-lenses arranged in multiple layers is capable of further expanding the light beam and improving an amplification factor of the light beam of the beam-expanding layer. In the embodiments of the present disclosure, specific number of layers of the secondary micro-lenses arranged in multiple layers is not limited to three layers as illustrated, for example, specific number of layers of the secondary micro-lenses arranged in multiple layers is alternatively selected as two, four or more layers. By way of example, the multilayered micro-lens structure is realized, for example by multiple exposures with a half tone mask. The micro-lens units described in the embodiments of the present disclosure may be prepared, for example by methods comprising but being not limited to: photoresist hot melting, three-dimensional diffusion lithography and other methods in the relevant art.

In the example illustrated in FIG. 1 (a), each group of light-emitting units comprises respective three light-emitting units 20a, 20b and 20c corresponding to respective three sub-pixels 40a, 40b and 40c, respectively. Each micro-lens unit 60 is transparent to the light beams emitted by the respective three light-emitting units 20a, 20b and 20c. This facilitates the reduction in optical loss. For example, the micro-lens unit 60 is formed by a transparent resin material. In the embodiments of the present disclosure, each group of light-emitting units is not limited to comprise the respective three light-emitting units as above, for example, it may alternatively comprise one, two, or more than three light-emitting units; accordingly, each micro-lens unit 60 may be configured to be transparent for the light beams emitted by a respective group of light-emitting units which are provided to face and to be opposite to said each micro-lens unit 60.

As mentioned above, in the example illustrated in FIG. 1 (a), each group of light-emitting units corresponds to a respective image pixel, which comprises three sub-pixels of a red sub-pixel, a green sub-pixel and a blue sub-pixel. However, embodiments of the present disclosure are not limited thereto; for example, each group of light-emitting units also alternatively corresponds to more than one image pixel. That is to say, each group of light-emitting units for example corresponds to at least one complete image pixel. This method is advantageous to expand the light beam based on the complete image pixel to be formed. In embodiments of the present disclosure, each group of light-emitting units for example also corresponds to a plurality of sub-pixels, which are for example sub-pixels in one and the same image pixel, or alternatively, sub-pixels in different image pixels.

As illustrated in FIG. 2 (a), in each sub-beam generation component, the respective group of light-emitting units comprises a plurality of light-emitting units, and the respective micro-lens unit comprises a plurality of micro-lenses, the plurality of light-emitting units and the plurality of micro-lenses are arranged in one-to-one correspondence to be opposite to and to face towards each other (here, the definition of "to be opposite to and to face towards" is as described above, i.e., the orthogonal projections of the plurality of light-emitting units on the base substrate 10 and the orthographic projections of the plurality of micro-lenses on the base substrate 10 at least partially overlap with each other), and each sub-beam generation component is configured to present at least one complete image pixel (illustrated as presenting one complete image pixel). As compared with the structure as illustrated in FIG. 1 (a), a main difference of the structure of a display panel 100b as illustrated in FIG. 2 (a) lies in that, although the respective group of light-emitting units 20 in each sub-beam generation component also comprises the plurality of light-emitting units 20 and each sub-beam generation component is configured to present the respective single image pixel, at least one micro-lens contained in the micro-lens unit comprises the plurality of micro-lenses. In other words, in the structure as illustrated in FIG. 2 (a), the respective group of light-emitting units 20 in each sub-beam generation component (said each sub-beam generation component functions as a physical pixel) comprises the plurality of light-emitting units, and the micro-lens unit comprises the plurality of micro-lenses (specific number of micro-lenses is the same as the number of the plurality of light-emitting units), such that each sub-beam generation component corresponds to the respective single image pixel. By taking a condition of R, G, B sub-pixels as illustrated in FIG. 2 (a) as an example, the three light-emitting units 20 as illustrated correspond to the red (R) sub-pixel, the green (G) sub-pixel and the blue (B) sub-pixel respectively. And the micro-lens unit 60 comprises the plurality of micro-lenses, i.e., three micro-lenses 60a, 60b and 60c as illustrated, and the three micro-lenses are respectively arranged to face and to be opposite to the three light-emitting units 20. Since each micro-lens merely corresponds to a respective one light-emitting unit 20 of the same color, then the micro-lenses 60a, 60b, 60c in the micro-lens unit 60 are for example formed by colored optical filters of different colors. The colored optical filters of different colors are respectively designed for the colors of the light emitting units 20 facing and opposite to respective micro-lens 60a, 60b and 60c in the micro-lens unit 60. For example, the colored optical filters of different colors may be configured to filter the light beam 50 respectively, specifically by removing (i.e., optically filtering out) color components from the light beam 50 which have colors other than respective colors of the light-emitting units 20 facing and opposite to the micro-lens unit 60, or by removing (i.e., optically filtering out) color components from the light beam 50 which have colors other than respective colors of single sub-pixels corresponding to the light-emitting units 20. This arrangement facilitates a further purification of color(s) of the light beam 50 passing through respective micro-lenses which are formed by colored optical filters of different colors in the micro-lens unit 60, so as to improve the display effect.

FIG. 1 (b) illustrates a structural schematic view of a further exemplary display panel based on the display panel as illustrated in FIG. 1 (a), wherein the optical transmission medium of the display panel is additionally provided with a color filtering section for further purification of each monochromatic sub-beam; FIG. 2 (b) illustrates a structural schematic view of a further exemplary display panel based on the display panel as illustrated in FIG. 2 (a), wherein the optical transmission medium of the display panel is additionally provided with a color filtering section for further purification of each monochromatic sub-beam.

By way of example, the structure for filtering and purifying color(s) of the light beam emitted by the light-emitting units may also be provided in the optical transmission medium 31 of the beam-expanding layer 30, that is to say, one or more types of color filtering sections may be provided in the optical transmission medium 31, each type of which is used to merely admit/allow a respective component of light of the respective color to pass therethrough. For example, the group of light-emitting units comprises the plurality of light-emitting units, and the micro-lens unit comprises the plurality of micro-lenses, the plurality of light-emitting units and the plurality of micro-lenses are arranged in one-to-one correspondence to face and to be opposite to each other (here, the definition of "to be opposite to and to face towards" is as described above, i.e., the orthogonal projections of the plurality of light-emitting units on the base substrate 10 and the orthographic projections of the plurality of micro-lenses on the base substrate 10 at least partially overlap with each other), and each sub-beam generation component is configured to present at least one complete image pixel (illustrated as presenting one complete image pixel), and the color filtering sections in the beam-expanding layer comprise a plurality of color filtering sections whose colors are the same as those of respective ones of the plurality of light-emitting units respectively. Specifically, for the example as illustrated in FIG. 2 (b), the display panel 100b comprises at least the first sub-pixel 40a, the second sub-pixel 40b, and the third sub-pixel 40c, wherein, for example, for the first sub-pixel 40a and the second sub-pixel 40b adjacent to each other, the first sub-pixel 40a has a first color (e.g., red), and the second sub-pixel 40b has a second color (e.g., green). The first light-emitting unit 20a corresponds to the first sub-pixel 40a, and the second light-emitting unit 20b corresponds to the second sub-pixel 40b. Correspondingly, the micro-lens unit 60 disposed in the beam-expanding layer 30 comprises the first micro-lens 60a facing and opposite to the first light-emitting unit 20a and a second micro-lens 60b facing and opposite to the second light-emitting unit 20b. And correspondingly, in the optical transmission medium 31, a first color filtering section 33a and a second color filtering section 33b are provided. Specifically, the first color filtering section 33a is arranged to enclose the light emergent surface 61a of the first micro-lens 60a and abuts closely against the light emergent surface 61a of the first micro-lens 60a, and is configured to filter color components of the light beam incident thereon which have colors other than the first color. Similarly, the second color filtering section 33b is arranged to enclose the light emergent surface 61b of the second micro-lens 60b and abuts closely against the light emergent surface 61b of the second micro-lens 60b, and the second color filtering section 33b is configured to filter color components of the light beam incident thereon which have colors other than the second color. The above settings of the first color filtering section 33a and the second color filtering section 33b facilitate color purification for the light beams of different colors emitted by different light-emitting units respectively.

Of course, specific number of color filtering sections may not be limited to two types as above. As illustrated in the example of FIG. 2 (b), a third color filtering section 33c is also provided in the optical transmission medium 31, and the third color filtering section is arranged to enclose the light emergent surface 61c of the third micro-lens 60c and abuts closely against the light emergent surface 61c of the third micro-lens 60c. The third micro-lens 60c faces and is opposite to the third light-emitting unit 20c. Similar to the foregoing contents, the third color filtering section 33c is for example configured to purify the color of a light beam emitted from the third light-emitting unit 20c. In embodiments of the present disclosure, specific number of color filtering sections is for example also more than three, or is even merely one.

Similarly, in the example of FIG. 1 (a), for each light-emitting unit in each group of light-emitting units 20, a plurality of color filtering sections of different colors having the same number as that of the light-emitting units are also provided, for example downstream a common single micro-lens which functions as the micro-lens unit, and each color filtering section is for example configured to optically filter color components from the light beam emitted by respective one light-emitting unit which have colors other than the color of respective one light-emitting unit 20 facing and opposite to said each color filtering section, or to remove color components having colors other than the color of the respective single sub-pixel corresponding to the respective one light-emitting unit 20, so as to purify the color of the light beam emitted by respective one light-emitting unit.

By way of example, the above-mentioned colored optical filters or color filtering section(s) may for example be formed by materials having following components of respective contents/proportions: 55%~65% propylene glycol methyl ether acetate, 15%~20% ethyl ethoxypropionate, 7%~13% polyethylene glycol monomethyl ether, 1~8% resin, 1%~9% pigment (red (R)/green (G)/blue (B)) and 2%~9% additive. However, the embodiments of the present disclosure are not limited thereto, and various materials capable of realizing corresponding optical filtering functions of relevant art in the field may be used.

Figure 9:
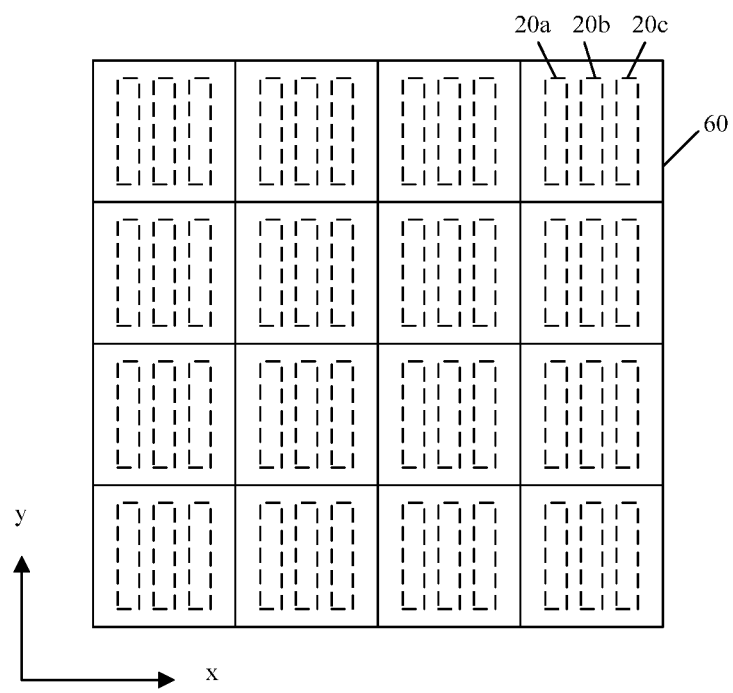
FIG. 9 illustrates a schematic view of an exemplary correspondence relationship between micro-lens units and light-emitting units.

FIG. 9 illustrates a schematic view of an exemplary correspondence relationship between micro-lens units 60 and light-emitting units 20. FIG. 9 illustrates the plurality of micro-lens units 60, each of which is arranged to face and to be opposite to three light-emitting units 20a, 20b and 20c each of which is in a form of strip shape; in other words, the orthogonal projection of each micro-lens unit 60 on the base substrate 10 at least partially overlaps with the orthogonal projection of the three light-emitting units 20a, 20b and 20c on the base substrate 10, each of the three light-emitting units 20a, 20b and 20c being in the form of strip shape on the base substrate 10. It should be noted that in practice, there may for example be various specific forms of layout of light-emitting units, which may not be limited to the arrangement in a rectangular array as illustrated in FIG. 9, for example, there are other forms of dislocated arrangement alternatively. Specific shape and specific arrangement form of the micro-lens unit 60 may be designed and adjusted, for example, depending on specific form of layout of practical light-emitting units.

Figure 11:
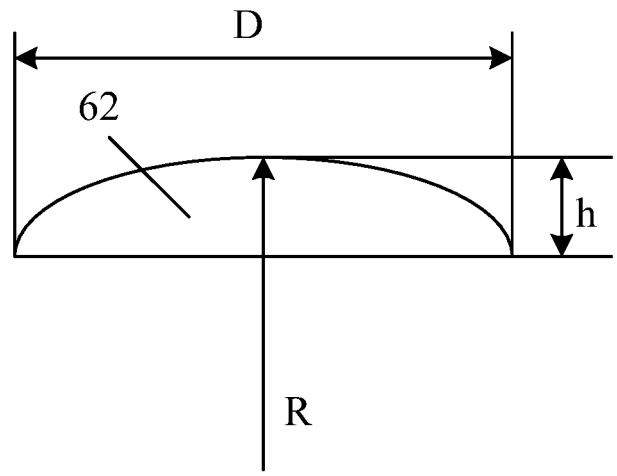
FIGS. 11 and 12 show sectional views of exemplary structures of a micro-lens unit, respectively.
Figure 12:
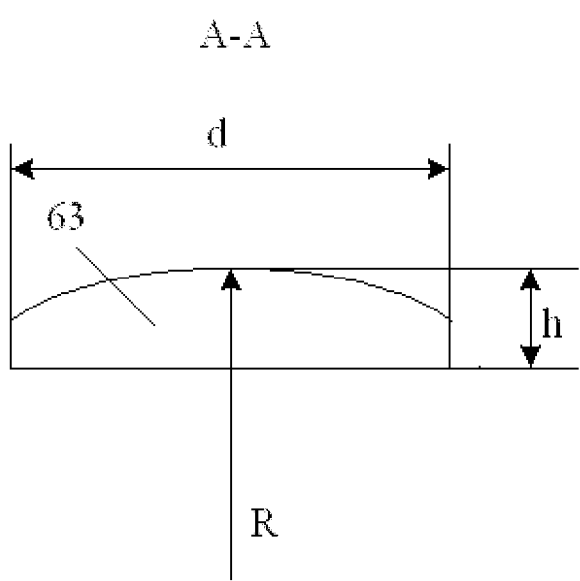
Figure 13:
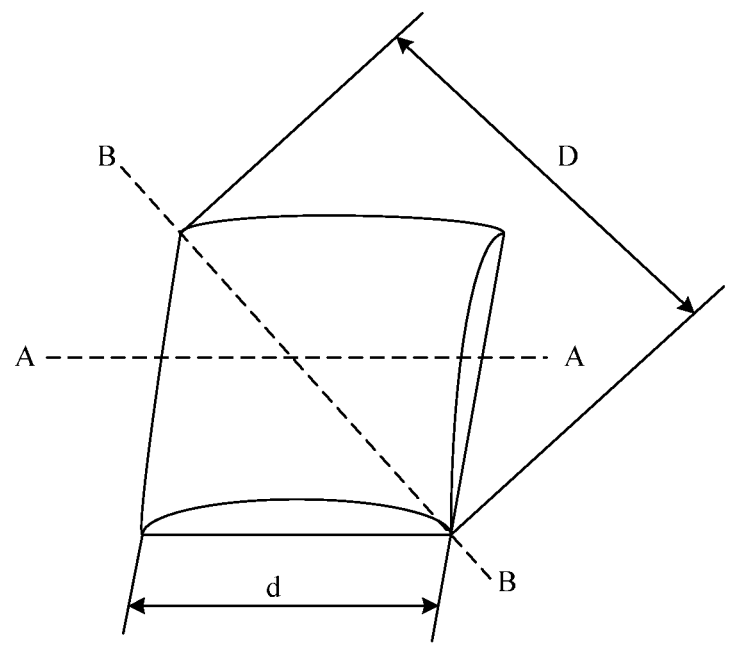
FIG. 13 illustrates a perspective view of an exemplary configuration of a micro-lens unit.

FIGS. 11 to 13 illustrate structural examples of the micro-lenses contained in the micro-lens unit 60. FIG. 11 illustrates a micro-lens 62 in a form of a spherical crown shape. For the micro-lens 62 in the form of a spherical crown shape, a diameter thereof at a bottom surface thereof being D, a radius of curvature thereof being R, and a height thereof being h, then, the structural dimensions of the micro-lens 62 in the form of a spherical crown shape meet the following formula (1):

$$(R-h)^2 = R^2 - \left(\frac{D}{2}\right)^2 \tag{1}$$

FIG. 13 illustrates a micro-lens 63 in the form of a spherical crown shape having a rectangular bottom surface, for example being observed from the rectangular bottom thereof. FIG. 12 illustrates a sectional view taken along a center line AA of FIG. 13. In the example as illustrated in FIG. 13, the micro-lens 63 in the form of a spherical crown shape having a rectangular bottom surface has its bottom surface in the form of a square whose each side has a length of d, and has its radius of curvature which is also R. Therefore, a sectional view cut in a diagonal direction (as illustrated by a center line BB in FIG. 13) is the same as that of the micro-lens 62 in the form of a spherical crown shape as illustrated in FIG. 11. Then, the structural dimensions of the micro-lens 63 in the form of a spherical crown shape having a rectangular bottom surface meet the following formula (2):

$$(R-h)^2 = R^2 - \frac{d^2}{2} \tag{2}$$

The bottom surface of the micro-lens 62 in the form of a spherical crown shape as illustrated in FIG. 11 is in a form of a round shape; and the bottom surface of the micro-lens 63 in the form of a spherical crown shape having a rectangular bottom surface as illustrated in FIG. 12 and FIG. 13 is in a form of a rectangle shape (e.g., square shape, but not limited to square shape). A choice of specific different shapes of respective bottom surfaces of these micro-lenses facilitates adaption to requirements of different layouts of OLED light-emitting units on the base substrate, and may better match with the shape of layout of sub-pixels. For example, in a condition that the sub-pixels are designed to be arranged in a rectangular array, it is advantageous to choose to use the micro-lens 63 in the form of a spherical crown shape having a rectangular bottom surface.

By way of example, each micro-lens unit 60 is capable of expanding the light beam emitted from the respective group of light-emitting units 20 facing and opposite to the micro-lens unit 60 in two directions (e.g., the x direction and the y direction as illustrated in FIG. 9) which are perpendicular to each other and orthogonal to the normal direction of the display panel, e.g., in a condition that each micro-lens unit adopts the exemplary micro-lens structure as illustrated in FIG. 11 to FIG. 13. However, in embodiments of the present disclosure, each micro-lens unit 60 is for example also alternatively configured to enlarge/expand a light beam emitted from the respective group of light-emitting units 20 facing and opposite to the micro-lens unit 60 in merely one direction, for example, said each micro-lens unit 60 is in a form of a cylindrical lens.

For the specific design of micro-lens units, for example, it may be realized with the aid of commercial software, e.g., ZEMAX.

Figure 15:
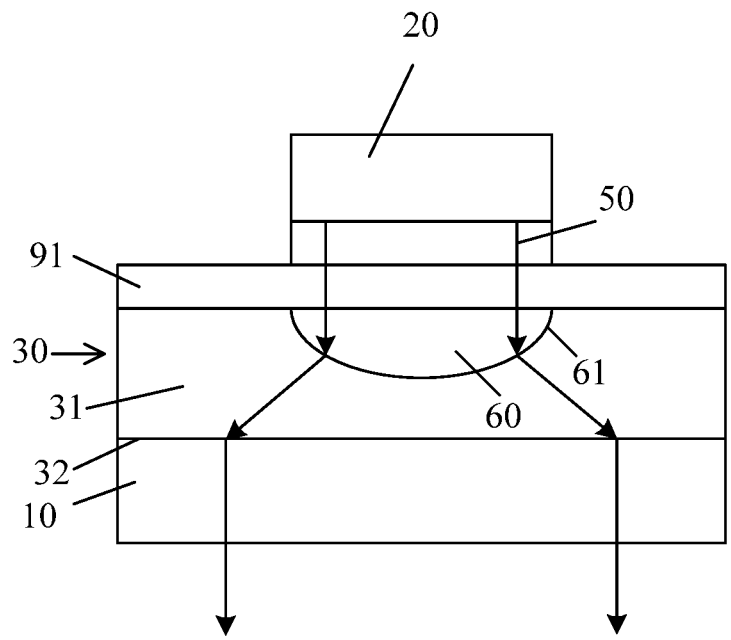
FIGS. 15 and 16 show an example of a micro-lens unit in a display panel according to embodiments of the present disclosure.
Figure 16:
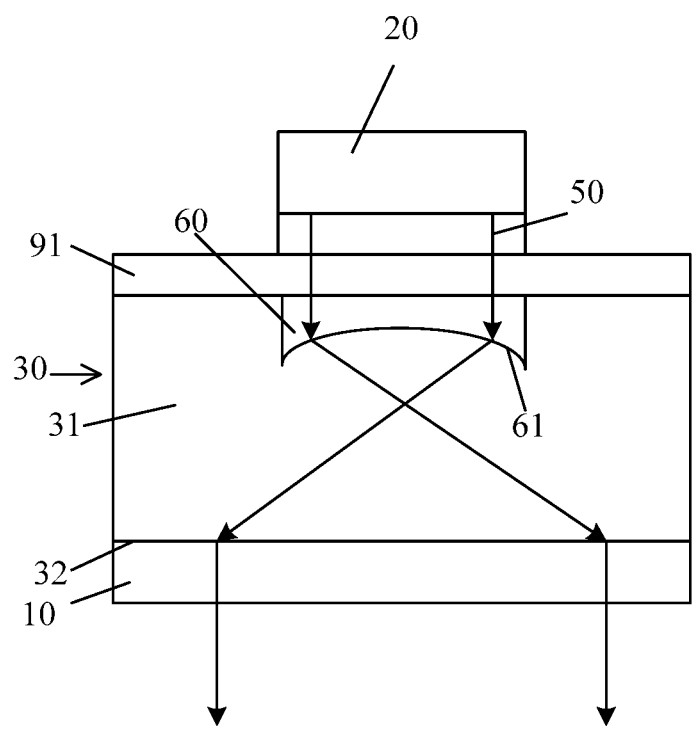

More specifically, each micro-lens 60 is for example a divergent micro-lens. In the example of the display panel as illustrated in FIG. 1(a) to FIG. 4(b), that is, in the example corresponding to the sub-beam generation component as illustrated in FIG. 5(a) to FIG. 8, each micro-lens unit 60 is illustrated to comprise at least one convex lens. However, the present disclosure is not limited thereto. For example, the micro-lens unit 60 for example also comprises at least one concave lens. FIG. 15 and FIG. 16 illustrate some examples of a micro-lens unit in the form of a convex lens or a concave lens. The micro-lens unit 60 as illustrated in FIG. 15 comprises a micro-lens in the form of a convex lens, and the refractive index of the optical transmission medium 31 surrounding the light emergent surface 61 of the micro-lens unit 60 is greater than that of the micro-lens unit 60. This is the same as the example as illustrated in FIG. 2 (a). As mentioned above, in such a condition, the micro-lens unit 60 has a divergence effect on the light beam 50, thereby realizing the beam-expanding function. FIG. 16 illustrates an example in which the micro-lens unit 60 comprises a micro-lens in the form of a concave lens. In the example of FIG. 16, the refractive index of the optical transmission medium 31 is greater than that of the micro-lens unit 60, and the micro-lens unit 60 has a convergence effect on the light beam 50, but the converged light beam will be transformed into a divergent beam after passing the focus of the micro-lens unit, therefore, the cross-section area of the light beam will be subjected to a process of above all getting smaller and then gradually getting larger. Therefore, in a condition that the beam-expanding layer 30 is set to be thick enough such that the light beam 50 may be subjected to a process of above all converging and then diverging during a process of passing through the beam-expanding layer 30, and the cross-sectional area of the light beam after divergence is greater than the cross-sectional area of the light beam being incident on the beam-expanding layer 30, then, the beam-expansion function may also be realized. In the example as illustrated in FIG. 15 as above, for example, the thickness of the beam-expanding layer 30 is set to be less than the thickness of the beam-expanding layer 30 in the example as illustrated in FIG. 16, and an optical path of the light beam in the beam-expanding layer 30 as illustrated in FIG. 15 is shorter than that of the light beam in the beam-expanding layer 30 in the example of FIG. 16, facilitating reduction in the optical loss. For example, in the example as illustrated in FIG. 15 as above, the thickness of the beam-expanding layer 30 may even be set to be smaller than a focal length of the micro-lens unit 60.

In alternative embodiments, in the examples as illustrated in FIG. 15 and FIG. 16 as above, the refractive index of the optical transmission medium 31 may also be set to be smaller than that of the medium (e.g., the base substrate 10) outside the beam-expanding layer and abutting against the light output surface 32 of the beam-expanding layer 30, such that the light beam 50 exiting the light output surface 32 may be appropriately shrunk/converged as compared with a condition in which the light beam 50 is emitted from the light emitting unit, so as to avoid any mutual interference of colors of the sub-pixel presenting different colors.

In some embodiments of the present disclosure, for example, as illustrated in FIG. 1(a) and FIG. 2(a), the multiple groups of light-emitting units 20 are each in a form of a bottom emission type OLED light-emitting unit 20, and the beam-expanding layer 30 is located between the multiple groups of light-emitting units 20 and the base substrate 10. In such a configuration of a display panel having bottom emission type OLED light-emitting units 20, the base substrate 10 is for example used to support the beam-expanding layer 30 by directly abutting thereon. For example, the beam-expanding layer 30 is formed directly on the base substrate 10, while the OLED light-emitting units 20 are for example formed on top of the beam-expanding layer 30 facing away from the base substrate 10. The bottom emission type OLED light-emitting units 20 are arranged that its light emergent side faces towards the base substrate 10.

Figure 3A:
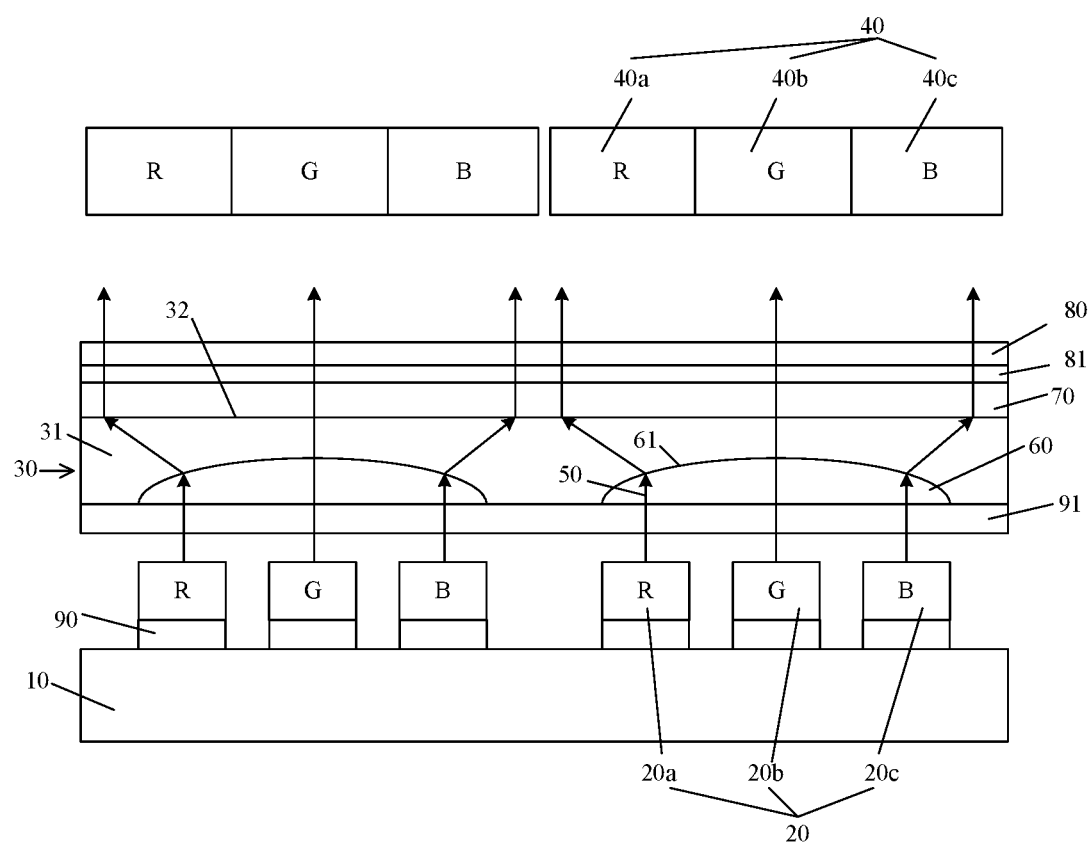
FIG. 3(a) illustrates a structural schematic view of a display panel according to still another embodiment of the present disclosure.
Figure 3B:
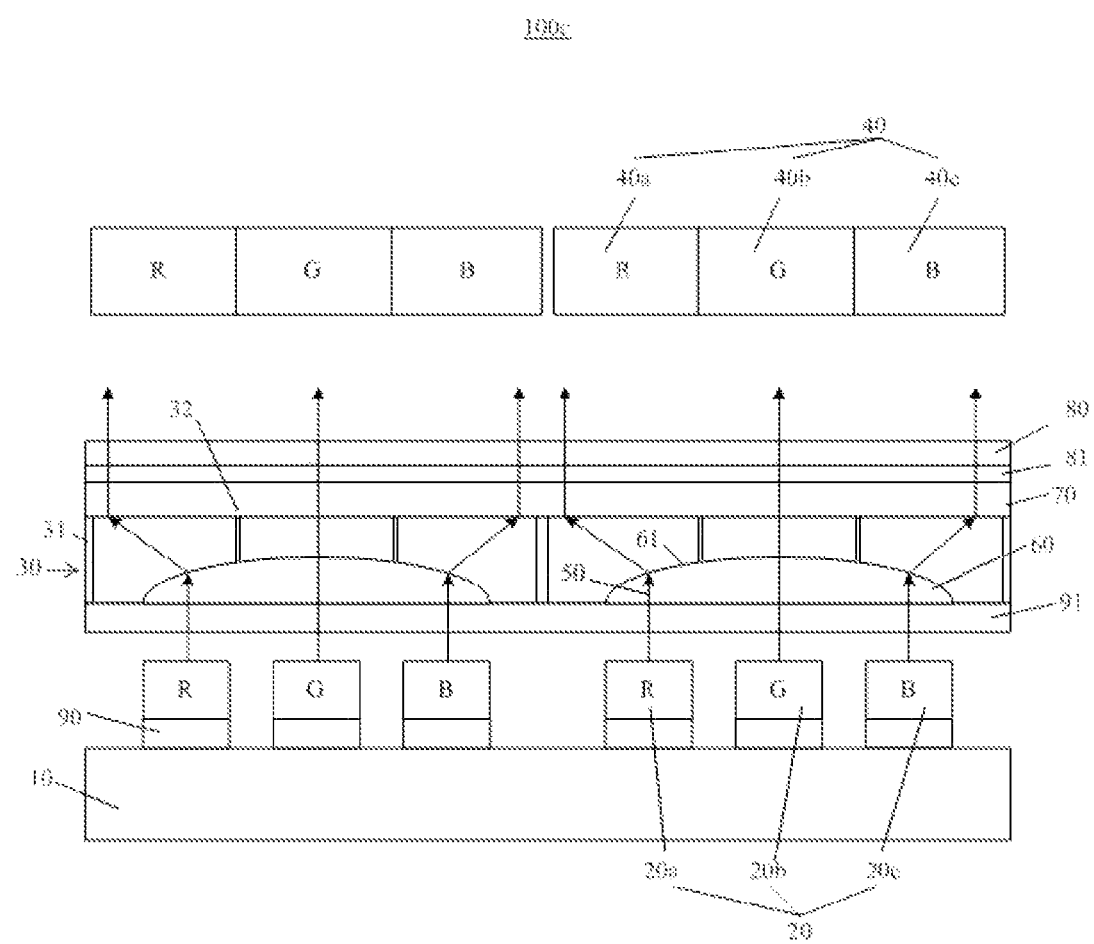
FIG. 3(b) illustrates a structural schematic view of a further exemplary display panel based on the display panel as illustrated in FIG. 3(a)

In some other embodiments, for example, as illustrated in FIG. 3(a), FIG. 3(b) and FIG. 4(a), FIG. 4(b), FIG. 3 (a) illustrates a structural schematic view of a display panel according to still another embodiment of the present disclosure, which is different from FIG. 1 (a) lying in that, FIG. 1 (a) illustrates a bottom emission type structure while FIG. 3 (a) illustrates a top emission type structure; FIG. 4 (a) illustrates a structural schematic view of a display panel according to yet another embodiment of the present disclosure, which is different from FIG. 2(a) lying in that, FIG. 2(a) illustrates a bottom emission type structure, while FIG. 4 (a) illustrates a top emission type structure. The multiple groups of light-emitting units 20 may for example also alternatively be top emission type OLED light-emitting units 20, and the beam-expanding layer 30 is located on one side of the multiple groups of light-emitting units 20 facing away from the base substrate 10. In such a configuration of a display panel having top emission type OLED light-emitting units 20, the base substrate 10 is for example used to support the OLED light-emitting unit 20 by directly abutting thereon. For example, the OLED light-emitting units 20 are formed directly on the base substrate 10, while the beam-expanding layer 30 may for example be formed on top of the OLED light-emitting units 20 facing away from the base substrate 10. The structure of the display panel 100c as illustrated in FIG. 3 (a) is similar to that of the display panel 100a as illustrated in FIG. 1(a) in terms of the correspondence between the micro-lens unit 60 and the light-emitting units, both structures of which have their respective correspondence in a form that each micro-lens unit 60 in a single sub-beam generation component faces and is opposite to the plurality of light-emitting units 20 in a respective group of light-emitting units 20. The structure of the display panel 100d as illustrated in FIG. 4 (a) is similar to that of the display panel 100b as illustrated in FIG. 2 (a) in terms of the correspondence between the micro-lens unit 60 and the light-emitting unit, both structures of which have their respective correspondence in the form that each micro-lens unit 60 in a single sub-beam generation component faces and is opposite to a single light-emitting unit 20.

Figure 4B:
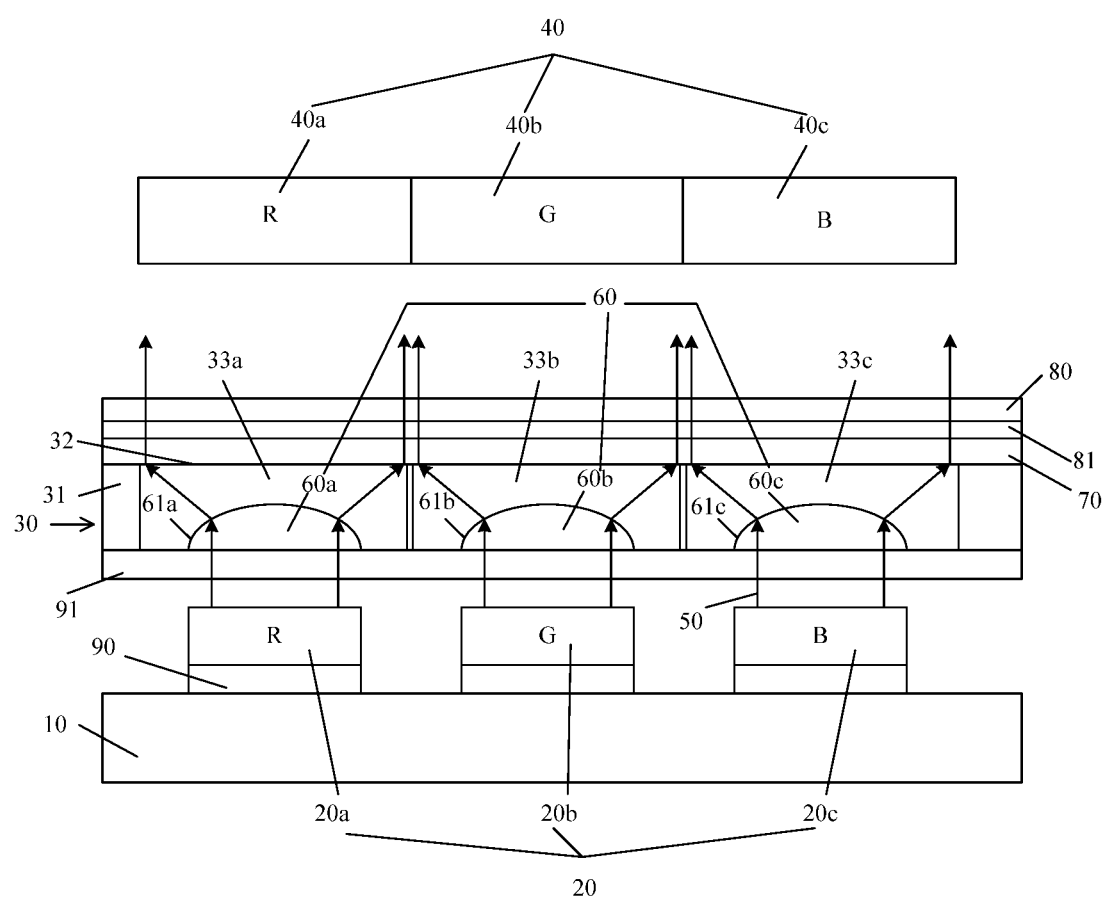
FIG. 4(b) illustrates a structural schematic view of a further exemplary display panel based on the display panel as illustrated in FIG. 4 (a)
Figure 5A:
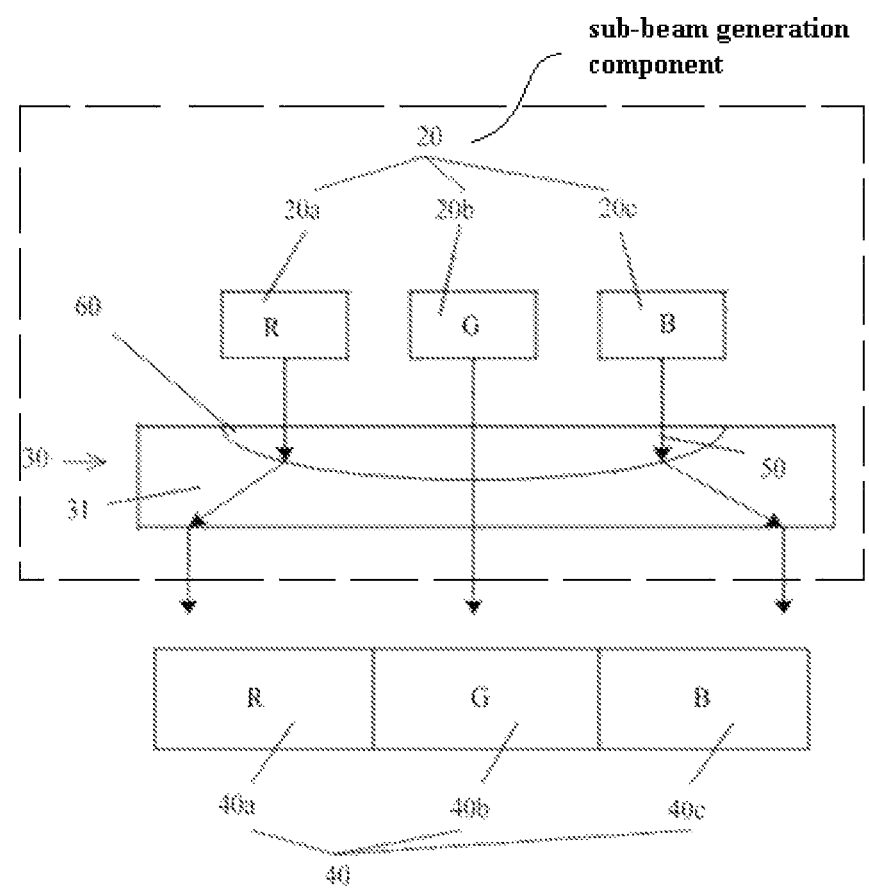
FIG. 5(a) illustrates a structural schematic view of a sub-beam generation component functioning as a physical pixel in a display panel as illustrated in FIG. 1(a) and FIG. 3(a)

In addition, FIG. 3(b) illustrates a structural schematic view of a further exemplary display panel based on the display panel as illustrated in FIG. 3(a), wherein the optical transmission medium of the display panel is additionally provided with a color filtering section for further purification of each monochromatic sub-beam; FIG. 4 (b) illustrates a structural schematic view of a further exemplary display panel based on the display panel as illustrated in FIG. 4 (a), wherein the optical transmission medium of the display panel is additionally provided with a color filtering section for further purification of each monochromatic sub-beam, respectively. According to embodiments of the disclosure, specific settings of the respective color filtering sections as illustrated in FIG. 3(b) and FIG. 4(b) are similar to those in FIG. 1 (b) and FIG. 2 (b), which will not be repeatedly described here.

In addition, FIG. 5 (a) illustrates a structural schematic view of a sub-beam generation components which may be used compatibly in a display panel as respectively illustrated in FIG. 1 (a) and FIG. 3(a) to function as a physical pixel therein; FIG. 5 (b) illustrates a structural schematic view of a sub-beam generation component which may be used compatibly in a display panel as respectively illustrated in FIG. 1 (b) and FIG. 3 (b) to function as a physical pixel therein; wherein the optical transmission medium of the beam-expanding layer is additionally provided with a color filtering section for further purification of each monochromatic sub-beam respectively.

Figure 6A:
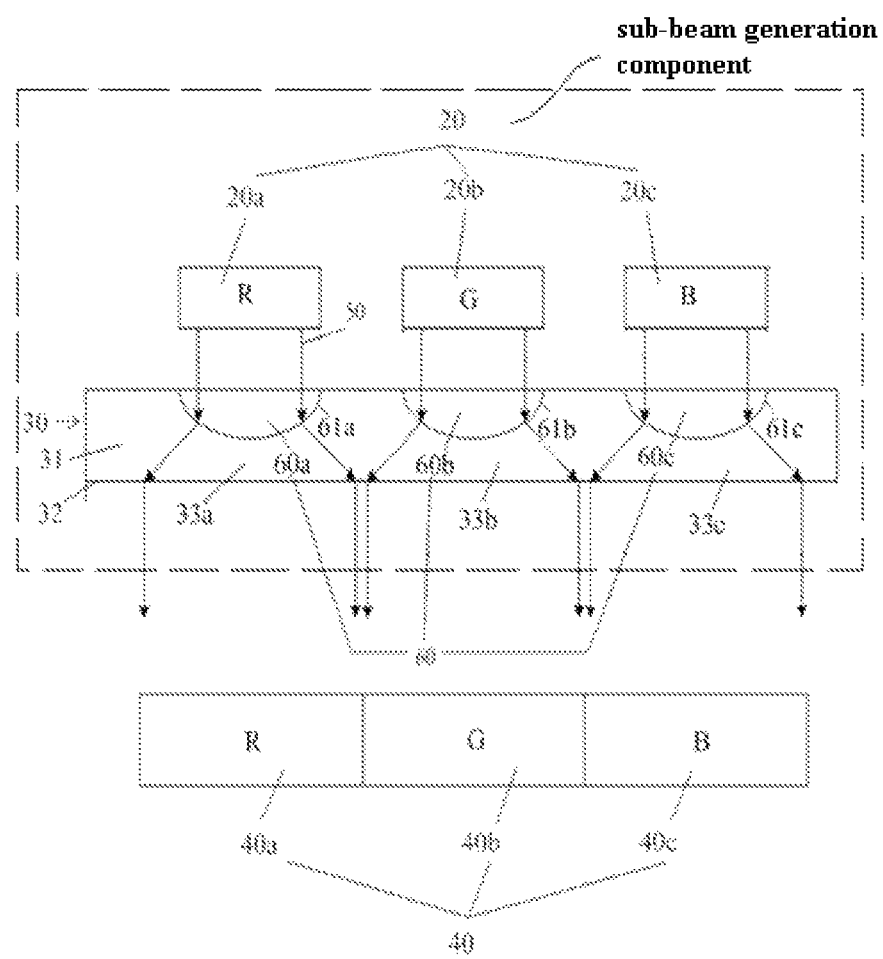
FIG. 6(a) illustrates a structural schematic view of a sub-beam generation component functioning as a physical pixel in a display panel as illustrated in FIG. 2(a) and FIG. 4(a)

FIG. 6 (a) illustrates a structural schematic view of a sub-beam generation components which may be used compatibly in a display panel as respectively illustrated in FIG. 2 (a) and FIG. 4 (a) to function as a physical pixel therein; FIG. 6 (b) illustrates a structural schematic view of a sub-beam generation components which may be used compatibly in a display panel as respectively illustrated in FIG. 2 (b) and FIG. 4 (b) to function as a physical pixel therein; wherein the optical transmission medium of the beam-expanding layer is additionally provided with a color filtering section for further purification of each monochromatic sub-beam respectively.

According to the embodiments of the disclosure, specific structures of these sub-beam generation components are described in the aforementioned embodiments, which will not be described repeatedly here.

Figure 7A:
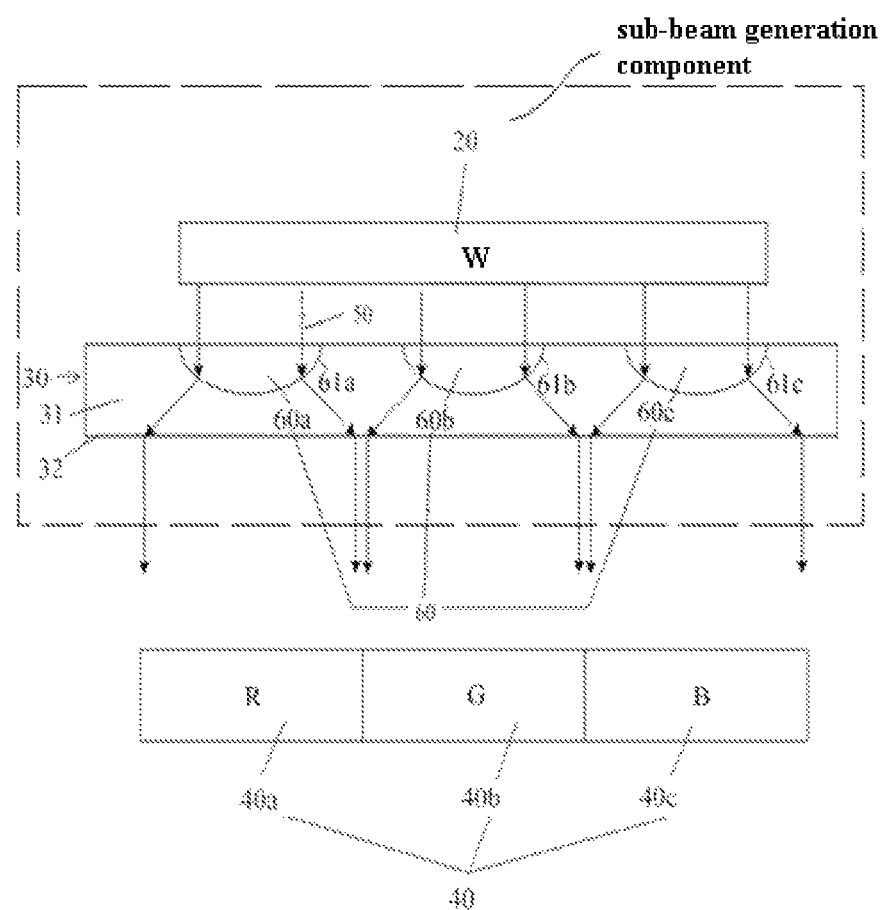
FIG. 7(a) illustrates a structural schematic view of a sub-beam generation component functioning as a physical pixel in a display panel according to embodiments of the present disclosure.
Figure 7B:
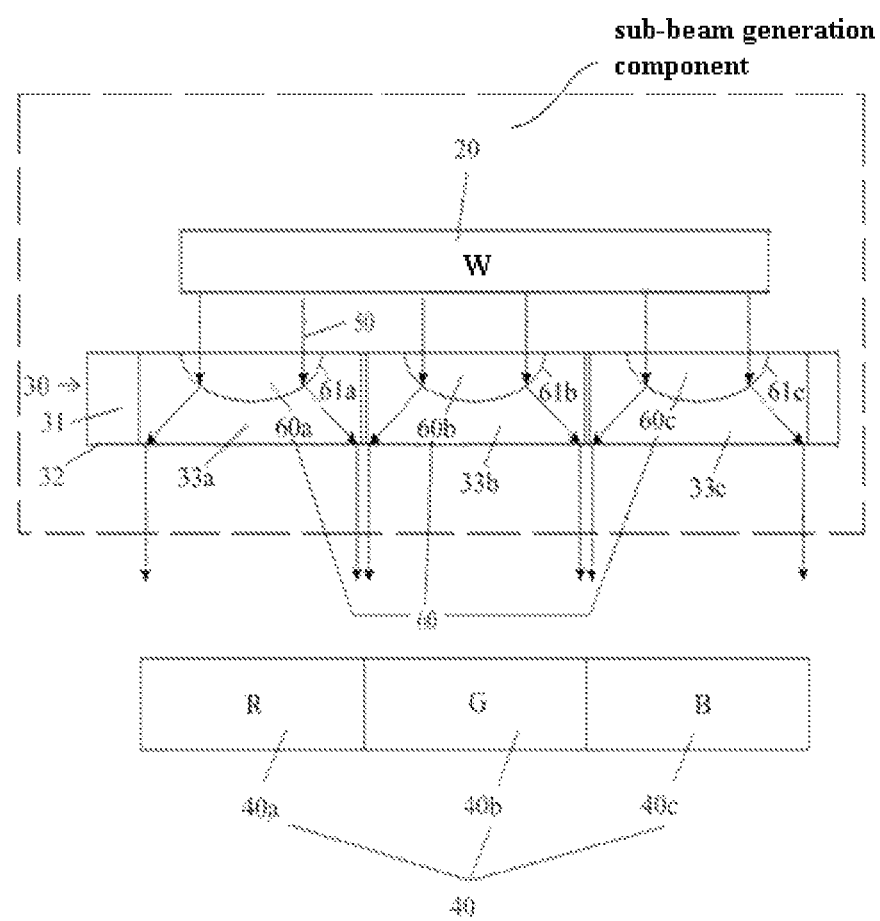
FIG. 7(b) illustrates a structural schematic view of a sub-beam generation component functioning as a physical pixel in a further exemplary embodiment based on the sub-beam generation component as illustrated in FIG. 7(a)

FIG. 7(a) illustrates a structural schematic view of a sub-beam generation component functioning as a physical pixel in a display panel according to embodiments of the present disclosure; and FIG. 7(b) illustrates a structural schematic view of a sub-beam generation component functioning as a physical pixel in a further exemplary embodiment based on the sub-beam generation component as illustrated in FIG. 7(a).

Next, a condition in which the respective group of light-emitting units in each sub-beam generation component comprises merely a single light-emitting unit is explored. According to embodiments of the present disclosure, for example, as illustrated in FIG. 7 (a), in a condition that the respective group of light-emitting units 60 in each sub-beam generation component comprises a single light-emitting unit (e.g., a white (W) light-emitting unit) and each sub-beam generation component is configured to present a single image pixel, as illustrated, then the micro-lens unit 60 facing and opposite to the single light-emitting unit for example comprises a plurality of micro-lens 60a, 60b, 60c; and in order to form a plurality of sub-beams of different colors by emitting a light beam from the single white (W) light-emitting unit for exiting respectively so as to present a plurality of sub-pixels of different colors and in turn to form image pixels corresponding to the sub-beam generation component, then, for example, the plurality of micro-lenses 60a, 60b and 60c are respectively formed by colored optical filters of different colors, and the optical filters of different colors are respectively configured to optically filter color components of the light beams having colors other than those of respective sub-pixels in the single image pixel to be presented.

Figure 5B:
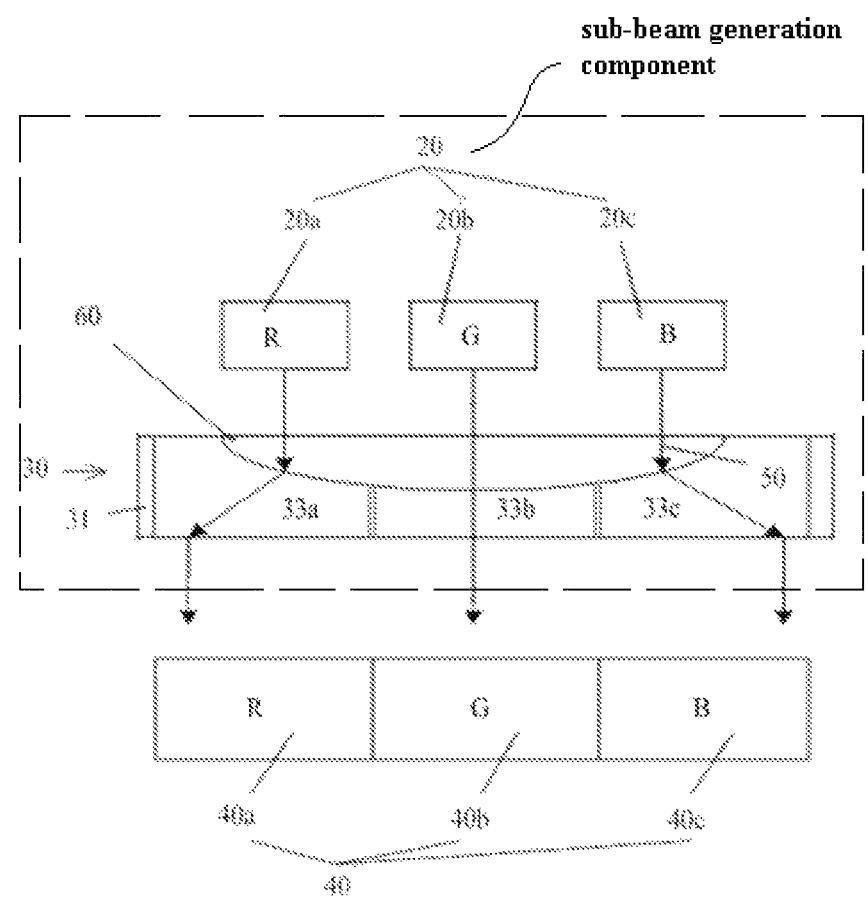
FIG. 5(b) illustrates a structural schematic view of a sub-beam generation component functioning as a physical pixel in a display panel as illustrated in FIG. 1(b) and FIG. 3(b)
Figure 6B:
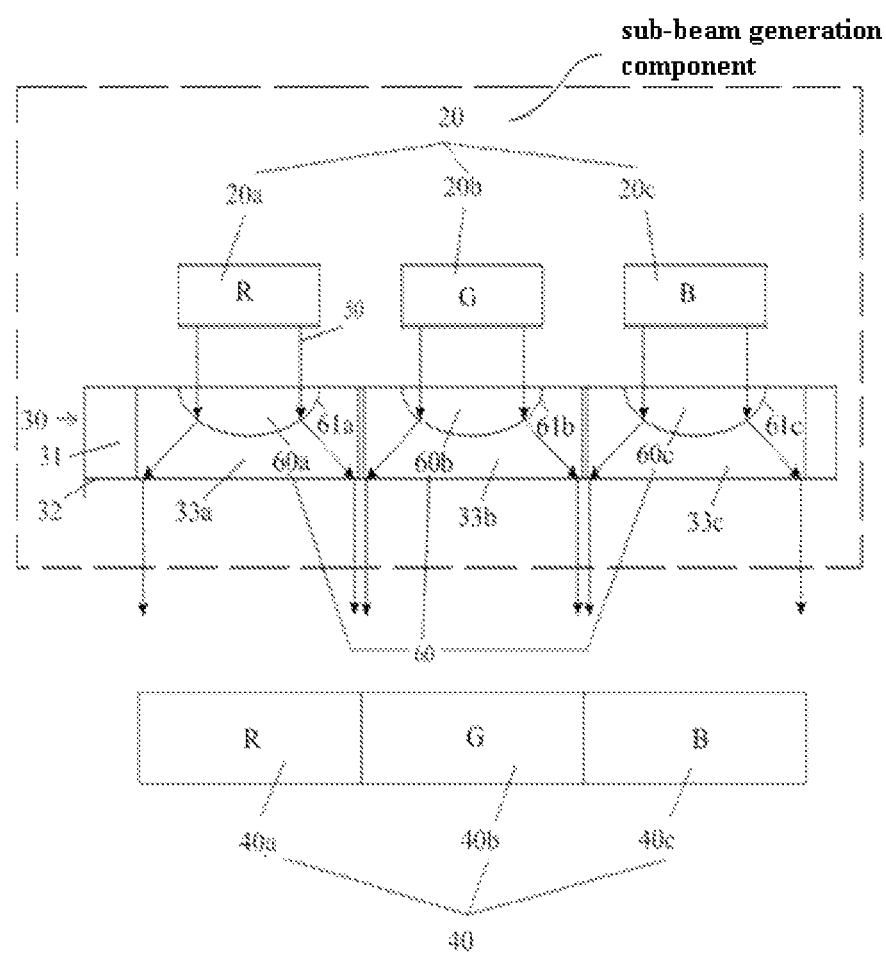
FIG. 6(b) illustrates a structural schematic view of a sub-beam generation component functioning as a physical pixel in a display panel as illustrated in FIG. 2(b) and FIG. 4(b)

And, according to the embodiments of the present disclosure, in the schematic structure of the sub-beam generation component functioning as a physical pixel in the further exemplary display panel as illustrated in FIG. 7 (b) based on the display panel as illustrated in FIG. 7 (a), the optical transmission medium of the display panel is additionally provided with a color filtering section for further purification of each monochromatic sub-beam, which setting is similar to those of the structural schematic views of respective sub-beam generation component functioning as a physical pixel in the display panel, as above illustrated in FIG. 5(b) and FIG. 6(b), wherein the optical transmission medium of the beam-expanding layer is additionally provided with a color filtering section for further purification of each single color sub-beam, which will not be described repeatedly here.

FIG. 8 illustrates a structural schematic view of a sub-beam generation component functioning as a physical pixel in a display panel according to embodiments of the present disclosure.

In addition, according to embodiments of the present disclosure, for example, as illustrated in FIG. 8, also in a condition that the respective group of light-emitting units 60 in each sub-beam generation component comprises a single light-emitting unit (e.g., a white (W) light-emitting unit), and each sub-beam generation component is configured to present a single image pixel, then, for example as illustrated, the micro-lens unit facing and opposite to the single light-emitting unit comprises merely one micro-lens 60; and in a condition that the light beam emitted from the single white (W) light-emitting unit is incident on the micro-lens unit comprising merely the single micro-lens, in order to form a plurality of sub-beams of different colors for exiting respectively so as to present a plurality of sub-pixels of different colors and in turn to define jointly/collectively thereby a respective image pixel corresponding to the sub-beam generation component, then, the optical transmission medium of the display panel is additionally provided with a color filtering section for further purification of each single color sub-beam, and the color filtering section comprises a plurality of color filtering sub-pieces which are spaced apart from one another and are configured to optically filter color components of the light beams having colors other than those of respective sub-pixels in the single image pixel to be presented, which will not be described repeatedly here.

And, by way of example, each of the display panels 100a, 100b, 100c and 100d according to embodiments of the present disclosure for example also comprises a sealing layer 70 and a circular polarizer 80. The sealing layer 70 is for example configured to seal the structure of the display panel. The multiple groups of light-emitting units and the beam-expanding layer 30 are for example arranged between the base substrate 10 and the sealing layer 70. For example, the circular polarizer 80 is arranged on a light output side of the display panel, more specifically for example on one side of the base substrate 10 located on the light emergent side of the light-emitting units 20 (as illustrated in FIG. 1 (a), FIG. 2 (a)), or is arranged on the light emergent side of the light-emitting units 20 on a side of the sealing layer 70 facing away from the light-emitting units 20 (as illustrated in FIG. 3, FIG. 4). In other words, for the bottom emission type OLED light-emitting units 20 as illustrated in FIG. 1(a) and FIG. 2(a), the circular polarizer 80 is for example arranged on an external side of the base substrate 10; while for the top emission type OLED light-emitting units 20 as illustrated in FIG. 3(a) and FIG. 4(a), the circular polarizer 80 is for example arranged on an external side of the sealing layer 70. The circular polarizer 80 is for example configured to prevent interference of the external ambient light on the displayed image(s). For example, an isolating layer 81 is additionally provided between the circular polarizer 80 and the base substrate 10 or the sealing layer 70.

By way of example, for better control of the light-emitting units 20, the display panel for example further comprises a TFT array layer 90. The TFT array layer 90 is for example located between the multiple groups of light-emitting units 20 and the base substrate 10. For example, an adhesive layer (e.g., UV adhesive layer) 91 is provided between the TFT array layer 90 and the beam-expanding layer.

In the above embodiments of the present disclosure, the structure of the display panel is introduced by taking a condition of three types of sub-pixels comprising R, G, B sub-pixels as an example. However, it should be understood that, embodiments of the present disclosure are not limited to the above three types of sub-pixels, for example, sub-pixels of other colors such as yellow and the like may also be adopted.

According to the general technical concept of the embodiments of the present disclosure, on the other hand, there is also provided a display device, comprising a display panel in any of the foregoing; and the display device for example further comprises a housing accommodating the display panel therein. The display device for example comprises any products or components having display function, such as display panel, electronic paper, mobile phone, tablet computer, television set, monitor, laptop computer, digital photo frame, navigator and the like. The display device similarly has all the advantages of the above display device, and will not be described repeatedly here.

As compared with the relevant art, the embodiments of the present disclosure have the following beneficial effects:

In the display panel according to the embodiments of the present disclosure, there is provided a way to implement a large-sized display panel having a relatively small number of physical pixels. The display panel may at least partially weaken or even completely eliminate the sense of graininess (i.e., granular sensation) of the displayed images caused by relatively large spacing among the light-emitting units by using the divergence effect of the beam-expanding layer on the light being incident thereon, so as to obtain fine display picture quality in a condition that the spacing among the light-emitting units is relatively large. The display panel according to the embodiments of the disclosure may improve the heat dissipation property, reduce the difficulty in the evaporation process, and improve the yield of the large-sized display panel.

Although the technical concept of the disclosure is described by taking OLED light-emitting units as an example in the above embodiments, the light-emitting units in the embodiments of the disclosure may not be limited to OLED light-emitting units, for example, OLED light-emitting units in the above embodiments may be replaced with various other types of light-emitting units such as quantum dot light-emitting units, inorganic light-emitting diode light-emitting units, and the like. For these other types of light-emitting units, the embodiments of the present disclosure may also use the beam-expanding layer to weaken or eliminate the technical effects such as the sense of graininess (i.e., granular sensation) of the displayed images caused by the relatively large spacing among the light-emitting units and improve the heat dissipation property. Accordingly, the display panel according to the embodiments of the present disclosure may not be limited to the OLED display panel, but for example further comprises a display panel having various other types of light-emitting units.

The above embodiments merely exemplarily illustrate the principle and structure of the disclosure, rather than limiting the disclosure. It should be understood by those skilled in the art that any changes and improvements made to the disclosure are within the scope of the disclosure without departing from the overall concept of the disclosure. The scope of protection of the disclosure shall be subject to the scope defined in the claims of the application.

What is claimed is:

1. A display panel configured to display images, each of which comprises a plurality of image pixels, each image pixel comprising a plurality of sub-pixels of different colors, the display panel comprising:
    a base substrate; and
    a plurality of sub-beam generation components on the base substrate, each sub-beam generation component being configured to generate at least one sub-pixel in at least one image pixel of the plurality of image pixels and comprising:
    a group of light-emitting units comprising at least one light-emitting unit; and
    a beam-expanding layer, which is arranged on a light emergent side of the group of light-emitting units and configured to expand light beams emitted from the group of light-emitting units,
    wherein an orthogonal projection of the beam-expanding layer on the base substrate at least partially overlaps with an orthogonal projection of the group of light-emitting units on the base substrate,
    wherein the beam-expanding layer comprises a micro-lens unit comprising at least one micro-lens,
    wherein the beam-expanding layer also comprises an optical transmission medium whose refractive index is different from that of the micro-lens unit, and the optical transmission medium is arranged to enclose and to abut against a light emergent surface of the micro-lens unit, and
    wherein the refractive index of the optical transmission medium is less than that of a medium which is provided outside the beam-expanding layer and abuts against a light output surface of the beam-expanding layer.

2. The display panel according to claim 1, wherein the refractive index of the optical transmission medium is greater than that of the micro-lens unit.

3. The display panel according to claim 1, wherein the optical transmission medium is further provided with a color filtering section therein, which is configured to optically carry out a color filtering on light beams.

4. The display panel according to claim 3, wherein, in a condition that the group of light-emitting units in each sub-beam generation component comprises a single light-emitting unit and each sub-beam generation component is configured to present a single image pixel, the micro-lens unit comprises a micro-lens, and the color filtering section comprises a plurality of color filtering sub-pieces which are spaced apart from one another and configured respectively to optically filter out color components of the light beams which have colors other than those of respective sub-pixels in the single image pixel to be presented.

5. The display panel according to claim 4, wherein the single light-emitting unit is a white light-emitting unit.

6. The display panel according to claim 1, wherein, in a condition that the group of light-emitting units in each sub-beam generation component comprises a plurality of light-emitting units and each sub-beam generation component is configured to present at least one complete image pixel, the micro-lens unit comprises at least one micro-lens, and within the plurality of sub-beam generation components, a distance between adjacent light-emitting units in a same group of light-emitting units is smaller than a distance between the light emitting units respectively located in adjacent groups of light emitting units.

7. The display panel according to claim 6, wherein the micro-lens unit comprises a plurality of micro-lenses; and the plurality of light-emitting units and the plurality of micro-lenses are arranged opposite to each other in one-to-one correspondence; and a color filtering section located in the beam expanding layer comprises a plurality of color filtering portions whose colors are the same as those of the plurality of light-emitting units, respectively.

8. The display panel according to claim 1, wherein, in a condition that the group of light-emitting units in each sub-beam generation component comprises a single light-emitting unit and each sub-beam generation component is configured to present a single image pixel, the micro-lens unit arranged opposite to the single light-emitting unit comprises a plurality of micro-lenses formed respectively by colored optical filters of different colors, and the colored optical filters of different colors are configured respectively to optically filter out color components of the light beams which have colors other than those of respective sub-pixels in the single image pixel to be presented.

9. The display panel according to claim 8, wherein the single light-emitting unit is a white light-emitting unit.

10. The display panel according to claim 1, wherein in each micro-lens unit, the at least one micro-lens comprises a plurality of secondary micro-lenses arranged in multiple layers.

11. The display panel according to claim 10, wherein each micro-lens comprises a convex lens or a concave lens.

12. The display panel according to claim 11, wherein each micro-lens unit comprises a plurality of micro-lens each being in a form of a spherical crown shape or a spherical crown shape having a rectangular bottom surface.

13. The display panel according to claim 1, wherein each micro-lens unit expands a light beam emitted from the group of light-emitting units opposite to the micro-lens unit, in a direction orthogonal to a normal direction of the display panel or in two directions which are perpendicular to each other.

14. The display panel according to claim 1, wherein each light-emitting unit is a light-emitting unit in a form of an organic light-emitting diode.

15. The display panel according to claim 1, wherein each light-emitting unit in the group of light-emitting units is a light-emitting unit in a form of a bottom emission type organic light-emitting diode, and the beam-expanding layer is located between the group of light-emitting units and the base substrate.

16. The display panel according to claim 1, wherein each light-emitting unit in the group of light-emitting units is a light-emitting unit in a form of a top emission type organic light-emitting diode, and the beam-expanding layer is located on a side of the group of light-emitting units facing away from the base substrate.

17. A display device, comprising the display panel according to claim 1.

* * * * *